(12) United States Patent
Yu et al.

(10) Patent No.: US 12,455,420 B2
(45) Date of Patent: Oct. 28, 2025

(54) PHOTONIC SEMICONDUCTOR DEVICE AND METHOD OF MANUFACTURE

(71) Applicant: Taiwan Semiconductor Manufacturing Co., Ltd., Hsinchu (TW)

(72) Inventors: Chen-Hua Yu, Hsinchu (TW); Hsing-Kuo Hsia, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 359 days.

(21) Appl. No.: 17/818,809

(22) Filed: Aug. 10, 2022

(65) Prior Publication Data

US 2022/0382003 A1 Dec. 1, 2022

Related U.S. Application Data

(62) Division of application No. 16/929,799, filed on Jul. 15, 2020, now Pat. No. 12,092,861.

(Continued)

(51) Int. Cl.
G02B 6/42 (2006.01)
G02B 6/12 (2006.01)
(Continued)

(52) U.S. Cl.
CPC ....... *G02B 6/4214* (2013.01); *G02B 6/12002* (2013.01); *G02B 6/12004* (2013.01); *G02B 6/13* (2013.01); *G02B 6/136* (2013.01); *G02B 6/30* (2013.01); *G02B 6/4206* (2013.01); *G02B 6/4245* (2013.01); *G02B 6/4274* (2013.01); *H04Q 11/0005* (2013.01); *G02B 2006/12061* (2013.01); *G02B 2006/12107* (2013.01); *G02B 2006/12121* (2013.01);
(Continued)

(58) Field of Classification Search
CPC .......... G02B 6/12004; G02B 6/43; G02B 2006/12061; G02B 6/136; G02B 6/13; G02B 6/12002; G02B 6/132; G02B 6/131; H01L 25/167
See application file for complete search history.

(56) References Cited

U.S. PATENT DOCUMENTS 9,482,816 B2 11/2016 Van Campenhout et al.
9,874,690 B2 1/2018 Gambino et al.
(Continued)

FOREIGN PATENT DOCUMENTS

JP H02177481 A 7/1990
JP 2016166939 A 9/2016

*Primary Examiner* — Michelle R Connelly
(74) *Attorney, Agent, or Firm* — Slater Matsil, LLP

(57) ABSTRACT

A device includes a photonic routing structure including a silicon waveguide, photonic devices, and a grating coupler, wherein the silicon waveguide is optically coupled to the photonic devices and to the grating coupler; an interconnect structure on the photonic routing structure, wherein the grating coupler is configured to optically couple to an external optical fiber disposed over the interconnect structure; and computing sites on the interconnect structure, wherein each computing site includes an electronic die bonded to the interconnect structure, wherein each electronic die of the computing sites is electrically connected to a corresponding photonic device of the photonic devices.

20 Claims, 20 Drawing Sheets

Related U.S. Application Data

(60) Provisional application No. 62/906,978, filed on Sep. 27, 2019.

(51) Int. Cl.
  *G02B 6/124* (2006.01)
  *G02B 6/13* (2006.01)
  *G02B 6/136* (2006.01)
  *G02B 6/30* (2006.01)
  *G02B 6/34* (2006.01)
  *H04Q 11/00* (2006.01)

(52) U.S. Cl.
  CPC .......... *G02B 2006/12123* (2013.01); *G02B 2006/12147* (2013.01); *G02B 6/124* (2013.01); *G02B 6/34* (2013.01); *G02B 6/4204* (2013.01); *G02B 6/428* (2013.01); *H04Q 2011/0035* (2013.01)

(56) References Cited

U.S. PATENT DOCUMENTS

| | | | |
|---|---|---|---|
| 9,910,232 B2 | 3/2018 | Mekis et al. | |
| 10,578,799 B2 | 3/2020 | Doerr et al. | |
| 10,606,003 B2 | 3/2020 | Peterson et al. | |
| 10,795,079 B2 | 10/2020 | Venkatesan et al. | |
| 10,873,399 B2 | 12/2020 | Peterson et al. | |
| 11,002,915 B2 | 5/2021 | Kuo et al. | |
| 11,362,077 B2 | 6/2022 | Chang et al. | |
| 11,367,711 B2 | 6/2022 | Harris et al. | |
| 11,415,745 B2 | 8/2022 | Kuritsyn et al. | |
| 2002/0097962 A1* | 7/2002 | Yoshimura | G02B 6/124 385/16 |
| 2006/0177173 A1 | 8/2006 | Shastri et al. | |
| 2013/0307139 A1* | 11/2013 | Chen | B23K 20/233 257/737 |
| 2014/0010498 A1 | 1/2014 | Verslegers et al. | |
| 2015/0309261 A1* | 10/2015 | Kobyakov | G02B 6/124 385/14 |
| 2015/0331187 A1 | 11/2015 | Lee et al. | |
| 2017/0068050 A1 | 3/2017 | Babakhani et al. | |
| 2017/0299809 A1* | 10/2017 | Boeuf | H01L 21/76898 |
| 2018/0039021 A1 | 2/2018 | Usami | |
| 2018/0120524 A1 | 5/2018 | Mathai et al. | |
| 2018/0180808 A1 | 6/2018 | Zhang et al. | |
| 2018/0259730 A1 | 9/2018 | Hochberg et al. | |
| 2019/0243167 A1 | 8/2019 | Menezo et al. | |
| 2019/0363797 A1 | 11/2019 | Peterson et al. | |
| 2020/0003970 A1 | 1/2020 | Marchetti et al. | |
| 2020/0081184 A1 | 3/2020 | Orcutt et al. | |
| 2020/0161284 A1 | 5/2020 | Iida et al. | |
| 2020/0264390 A1 | 8/2020 | Wade et al. | |
| 2020/0310027 A1* | 10/2020 | Boeuf | G02B 6/43 |
| 2021/0118853 A1 | 4/2021 | Harris et al. | |
| 2021/0278590 A1 | 9/2021 | Harris et al. | |
| 2022/0128759 A1 | 4/2022 | Islam et al. | |
| 2022/0221646 A1 | 7/2022 | Kim et al. | |

* cited by examiner

PHOTONIC SEMICONDUCTOR DEVICE AND METHOD OF MANUFACTURE

PRIORITY CLAIM AND CROSS-REFERENCE

This application is a divisional of U.S. patent application Ser. No. 16/929,799, filed on Jul. 15, 2020, and entitled "Photonic Semiconductor Device and Method of Manufacture," which claims the benefits of U.S. Provisional Application No. 62/906,978, filed on Sep. 27, 2019, which applications are hereby incorporated herein by reference in its entirety.

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating optical components and electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
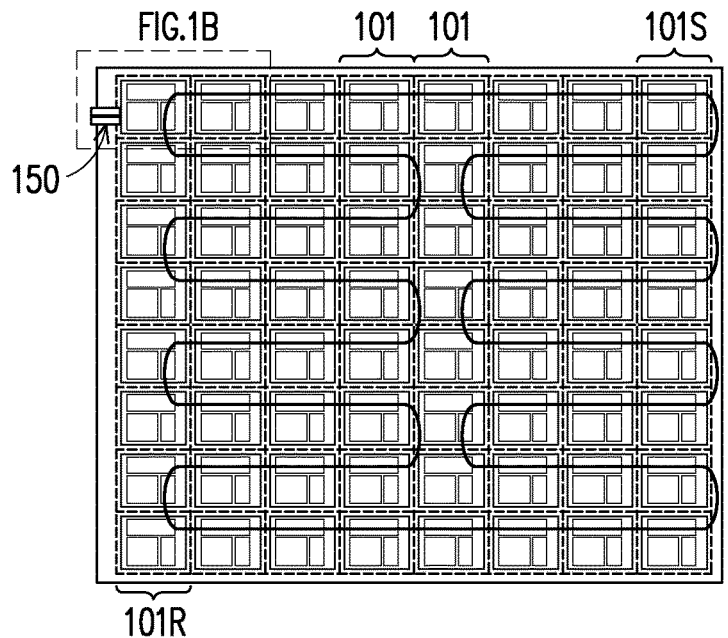
FIGS. 1A-B illustrate plan views of a photonic computing system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a package and the formation thereof are described. Three-dimensional (3D) packages including both optical devices and electronic devices, and the method of forming the same are provided, in accordance with some embodiments. In particular, computing sites of a photonic computing system are formed over a photonic routing structure that provides optical communication between the computing sites. Optical fibers may be attached vertically or horizontally to the photonic computing system to provide optical power. The intermediate stages of forming the packages are illustrated, in accordance with some embodiments. Some variations of some embodiments are discussed. Throughout the various views and illustrative embodiments, like reference numbers are used to designate like elements.

Figure 1B:
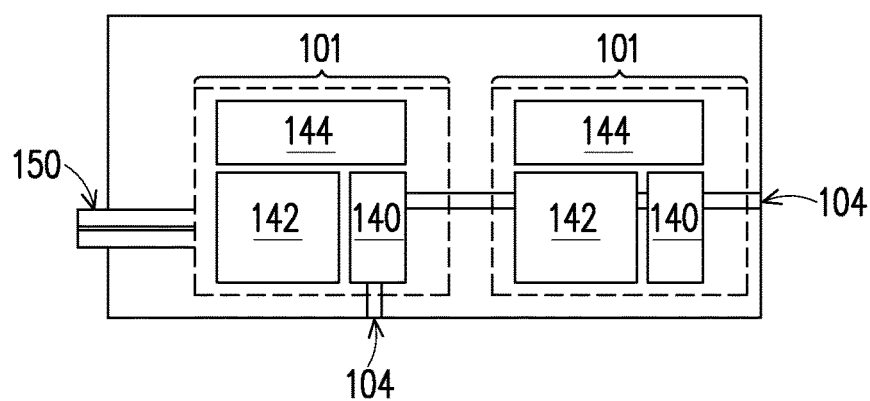

FIGS. 1A and 1B illustrate a schematic of a photonic computing system (PCS) 100, in accordance with some embodiments. The PCS 100 includes multiple sites 101, each of which is a separate computing system. The PCS 100 may be, for example, a multi-chip computing system or a high performance computing (HPC) system. FIG. 1A shows a plan view of a PCS 100 that includes multiple sites 101, and FIG. 1B is a detailed view of a region of the PCS 100 that includes two sites 101 (labeled in FIG. 1A). Some features of the PCS 100 are shown as semi-transparent in FIGS. 1A-B for clarity. A PCS 100 may include more or fewer sites 101 than shown, which may be arranged or configured differently than shown.

The sites 101 of the PCS 100 are interconnected by an optical network 104, which allows the separate computing system of each site 101 to communicate using optical signals. The optical network 104 may carry optical signals between sites 101 of the PCS 100 or may carry optical power to sites 101 of the PCS 100. In some embodiments, the optical network 104 is a closed loop (e.g., a ring) that is communicatively coupled to each site 101 of the PCS 100. In this manner, each site 101 may communicate with any of the other sites 101 using optical signals transmitted by the optical network 104. As an illustrative example, the site 101S in FIG. 1A may be able to use the optical network 104 to transmit optical signals to the site 101R. In some embodiments, the optical network 104 comprises silicon waveguides, although other types of optical pathways could be used. In some embodiments, the optical network 104 includes multiple waveguides, and each waveguide connects two of the sites 101 in a peer-to-peer manner. In some embodiments, the optical network 104 may not be a closed loop, may include branching sections, or may include separated sections. In some embodiments, the optical network 104 may also carry optical signals transmitted between the PCS 100 and external components. For example, the optical network 104 may be coupled to external components using one or more optical fibers 150 that are coupled to the optical network 104 by optical couplers 107 (see FIG. 3). In some embodiments, optical power is provided to the PCS 100 from an external source (e.g., a laser diode or the like) using one or more optical fibers 150.

In some embodiments, each site 101 includes photonic components 106 (see FIG. 3) coupled to the optical network 104 that facilitate the sending or receiving of optical signals. For example, the photonic components 106 may include a photodetector 106A coupled to the optical network 104 that detects optical signals within the optical network 104 and generates corresponding electrical signals. The photonic components 106 may also include an optical modulator 106B that generates optical signals within the optical network 104 by modulating optical power within the optical network 104. In this manner, the photonic components 106 facilitate the input/output (I/O) of optical signals to and from the optical network 104. In other embodiments, the photonic components 106 may include other components, such as laser diodes, optical signal splitters, or other types of photonic structures or devices. The photonic components 106 of each site 101 may be electrically connected to a corresponding electronic die 140, described in greater detail below.

In some embodiments, a site may include one or more devices such as semiconductor devices, chips, dies, system-on-chip (SoC) devices, system-on-integrated-circuit (SoIC) devices, the like, or a combination thereof. For example, as shown in FIGS. 1A-B, each site 101 may include one or more electronic dies 140, processing dies 142, and/or memory dies 144. The electronic dies 140, processing dies 142, memory dies 144, or other devices of a site 101 may collectively be referred to herein as "site devices." The sites 101 may include different site devices or a different configuration of site devices than shown in FIGS. 1A-B.

The processing dies 142 may include, for example, a central processing unit (CPU), a graphics processing unit (GPU), an application-specific integrated circuit (ASIC), a high performance computing (HPC) die, the like, or a combination thereof. The memory dies 144 may include, for example, a volatile memory such as dynamic random-access memory (DRAM), static random-access memory (SRAM), another type of memory, or the like. In some embodiments, the functionality of a processing die 142 and a memory die 144 may be combined in a single die.

Figure 2:
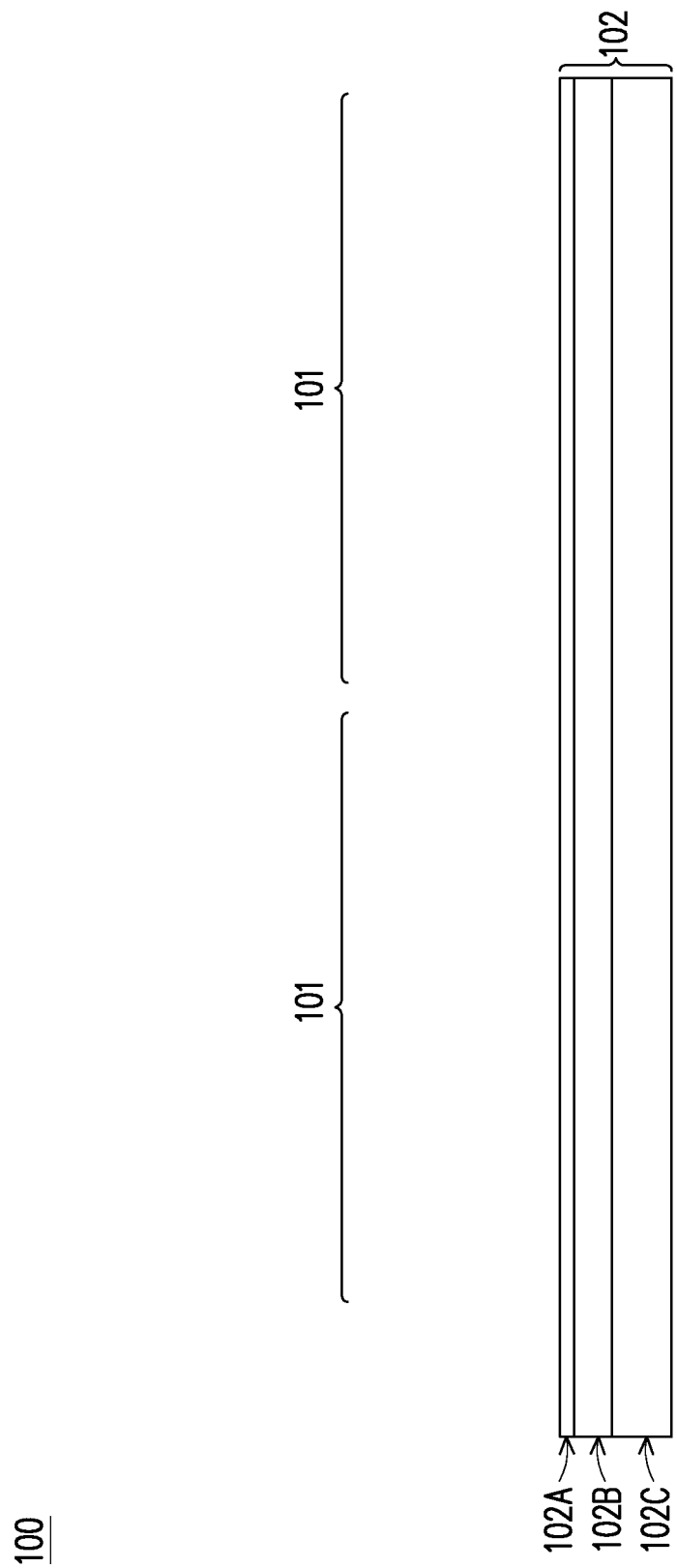
FIGS. 2 through 14 illustrate cross-sectional views of intermediate steps of forming a photonic computing system, in accordance with some embodiments.

The electronic dies 140 may be, for example, semiconductor devices, dies, or chips that are configured to interface with the optical network 104 using one or more photonic components 106, such as photodetectors 106A or optical modulators 106B (see FIG. 2). The electronic dies 140 may include integrated circuits for interfacing with the photonic components 106, such as circuits for controlling the operation of the photonic components 106. For example, the electronic dies 140 may include controllers, drivers, transimpedance amplifiers, the like, or combinations thereof. An electronic die 140 may also include a CPU, in some embodiments. The electronic dies 140 may include circuits for processing electrical signals received from photonic components 106, such as for processing electrical signals received from a photodetector 106A. The electronic dies 140 may control high-frequency signaling of the photonic components 106 according to electrical signals (digital or analog) received from another device, such as from the processing die 142 of the site 101. In some embodiments, the electronic dies 140 may be electronic integrated circuits (EICs) or the like that provide Serializer/Deserializer (SerDes) functionality. In this manner, the electronic dies 140 may act as an I/O interface between the sites 101 and the optical network 104.

FIGS. 2 through 13 show cross-sectional views of intermediate steps of forming a PCS 100 (see FIG. 13), in accordance with some embodiments. In FIGS. 2-12, regions are labeled in which two individual sites 101 of the PCS 100 are subsequently formed. Turning first to FIG. 2, a buried oxide ("BOX") substrate 102 is provided, in accordance with some embodiments. The BOX substrate 102 includes an oxide layer 102B formed over a substrate 102C, and a silicon layer 102A formed over the oxide layer 102B. The substrate 102C may be, for example, a material such as a glass, ceramic, dielectric, a semiconductor, the like, or a combination thereof. In some embodiments, the substrate 102C may be a semiconductor substrate, such as a bulk semiconductor or the like, which may be doped (e.g., with a p-type or an n-type dopant) or undoped. The substrate 102C may be a wafer, such as a silicon wafer (e.g., a 12-inch silicon wafer). Other substrates, such as a multi-layered or gradient substrate may also be used. In some embodiments, the semiconductor material of the substrate 102C may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The oxide layer 102B may be, for example, a silicon oxide or the like. In some embodiments, the oxide layer 102B may have a thickness between about 0.5 μm and about 4 μm. The silicon layer 102A may have a thickness between about 0.1 μm and about 1.5 μm, in some embodiments. The BOX substrate 102 may be referred to as having a front side or front surface (e.g., the side facing upwards in FIG. 2), and a back side or back surface (e.g., the side facing downwards in FIG. 2).

Figure 3:
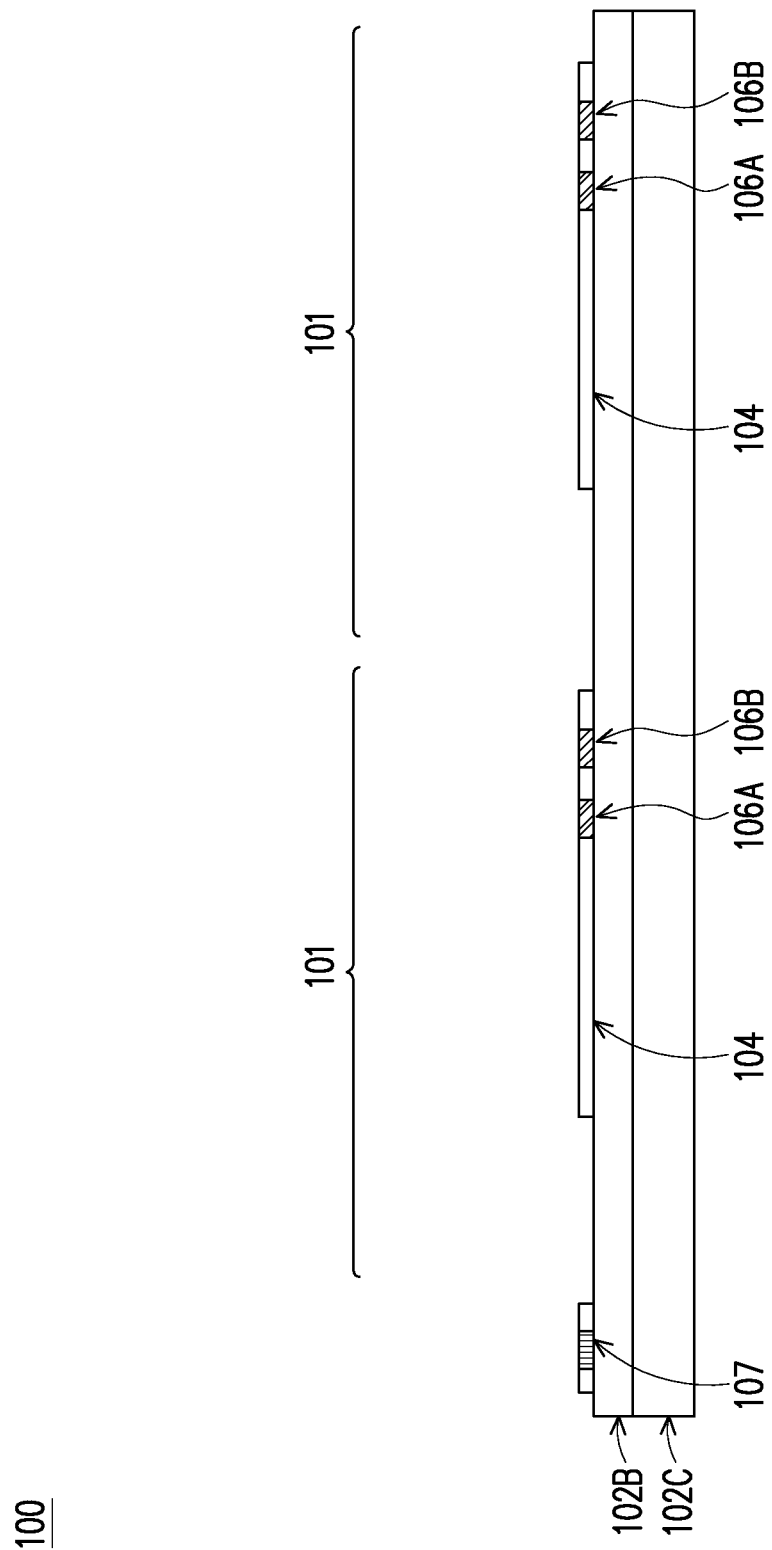

In FIG. 3, the silicon layer 102A is patterned to form silicon regions for the optical network 104 and the photonic components 106, in accordance with some embodiments. The silicon regions for the optical network 104 may include one or more waveguides, as described above. The silicon layer 102A may be patterned using suitable photolithography and etching techniques. For example, a hardmask layer (e.g., a nitride layer or other dielectric material, not shown in FIG. 3) may be formed over the silicon layer 102A and patterned. The pattern of the hardmask layer may then be transferred to the silicon layer 102A using one or more etching techniques, such as dry etching and/or wet etching techniques. For example, the silicon layer 102A may be etched to form recesses defining the waveguides, with the remaining unrecessed portions of the silicon layer 102A forming the waveguides, with sidewalls of the remaining unrecessed portions defining sidewalls of the waveguides. In some embodiments, more than one photolithography and etching sequence may be used in order to pattern the silicon layer 102A. One waveguide or multiple waveguides may be patterned from the silicon layer 102A to form the optical network 104. If multiple waveguides are formed, the multiple waveguides may be individual separate waveguides or connected as a single continuous structure. In some embodiments, one or more of the waveguides form a continuous loop. For example, in the cross-sectional view illustrated in FIG. 3, the portions of the waveguides shown may be part of a continuous loop comprising a single waveguide. In some cases, the patterned silicon layer 102A may be referred to as a "photonic layer." Other configurations or arrangements of waveguides or photonic components 106 are possible.

Still referring to FIG. 3, the photonic components 106 may be integrated with the optical network 104, and may be formed with the waveguides. The photonic components 106 may be optically coupled to the waveguides to interact with optical signals within the waveguides. The photonic components 106 may include, for example, photodetectors 106A and/or modulators 106B. For example, a photodetector 106A may be optically coupled to the optical network 104 to detect optical signals within a waveguide, and a modulator 106C may be optically coupled to the optical network 104 to generate optical signals within a waveguide by modulating optical power within the waveguide. In this manner, the photonic components 106 facilitate the input/output (I/O) of optical signals to and from the optical network 104.

In some embodiments, the photodetectors 106A may be formed by, for example, etching regions of the waveguides and growing an epitaxial material on the remaining silicon of the etched regions. The waveguides may be etched using acceptable photolithography and etching techniques. The epitaxial material may be, for example a semiconductor material such as germanium (Ge), which may be doped or undoped. In some embodiments, an implantation process may be performed to introduce dopants within the silicon of the etched regions as part of the formation of the photodetectors 104A. The silicon of the etched regions may be doped with p-type dopants, n-type dopants, or a combination.

In some embodiments, the modulators 106B may be formed by, for example, etching regions of the waveguides and then implanting appropriate dopants within the remaining silicon of the etched regions. The waveguides may be etched using acceptable photolithography and etching techniques. In some embodiments, the etched regions used for the photodetectors 106A and the etched regions used for the modulators 106B may be formed using one or more of the same photolithography or etching steps. The silicon of the etched regions may be doped with p-type dopants, n-type dopants, or a combination. In some embodiments, the etched regions used for the photodetectors 106A and the etched regions used for the modulators 106B may be implanted using one or more of the same implantation steps.

In some embodiments, one or more couplers 107 may be integrated with the optical network 104, and may be formed with the waveguides. The couplers 107 allow for optical signals and/or optical power to be transferred between an optical fiber 150 and the optical network 104 of the PCS 100. In some embodiments, the couplers 107 include grating couplers, which allow optical signals and/or optical power to be transferred between the PCS 100 and an optical fiber 150 that is vertically mounted over the PCS 100, such as optical fiber 150A shown in FIG. 14. In some embodiments, the couplers 107 include edge couplers, which allow optical signals and/or optical power to be transferred between the PCS 100 and an optical fiber 150 that is horizontally mounted near a sidewall of the PCS 100, such as optical fiber 150B shown in FIG. 14. The couplers 107 may be formed using acceptable photolithography and etching techniques. In some embodiments, the couplers 107 are formed using the same photolithography or etching steps as the waveguides or the photonic components 106. In other embodiments, the couplers 107 are formed after the waveguides of the optical network 104 are defined.

Figure 4:
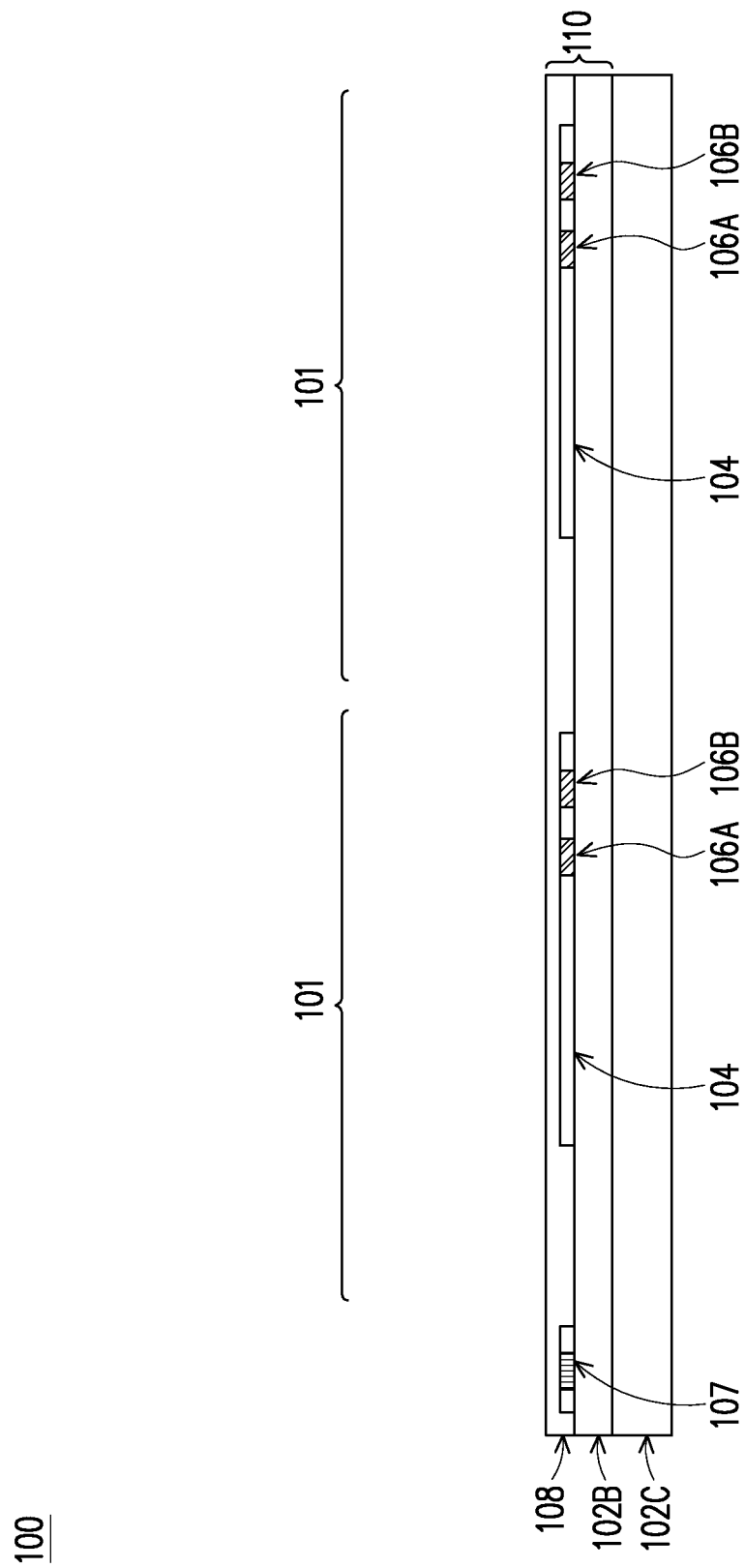

In FIG. 4, a dielectric layer 108 is formed on the front side of the BOX substrate 102 to form a photonic routing structure 110, in accordance with some embodiments. The dielectric layer 108 is formed over the optical network 104, the photonic components 106, the couplers 107, and the oxide layer 102B. The dielectric layer 108 may be formed of silicon oxide, silicon nitride, a combination thereof, or the like, and may be formed by CVD, PVD, atomic layer deposition (ALD), a spin-on-dielectric process, the like, or a combination thereof. In some embodiments, the dielectric layer 108 may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other dielectric materials formed by any acceptable process may be used. In some embodiments, the dielectric layer 108 is then planarized using a planarization process such as a chemical-mechanical polishing (CMP) process, a grinding process, or the like. The dielectric layer 108 may be formed having a thickness over the oxide layer 102B between about 50 nm and about 500 nm, in some embodiments. In some cases, a thinner dielectric layer 108 may allow for more efficient optical coupling between a coupler 106 and a vertically mounted optical fiber 150A.

Due to the difference in refractive indices of the material of the waveguides of the optical network 104 and the material of the dielectric layer 108 and/or the material of the oxide layer 102B, the waveguides may have high internal reflections that confine light (e.g., optical signals or optical power) within the waveguides. As such, the optical network 104, the photonic components 106, and the couplers 107 may be disposed between the dielectric layer 108 and the oxide layer 102B, forming the photonic routing structure 110 of the PCS 100. The particulars of the confinement may depend on the wavelength of the light and the reflective indices of the respective materials, which may be controlled for a particular application. In an embodiment, the refractive index of the material of the waveguides is higher than the refractive index of the material of the dielectric layer 108.

Figure 5:
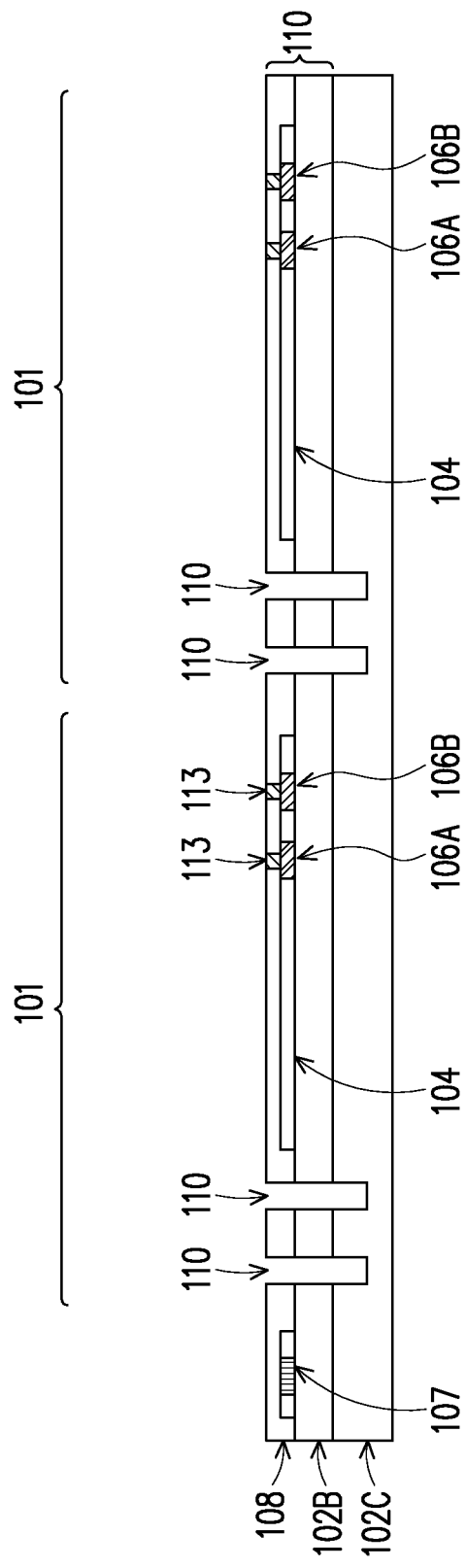

In FIG. 5, openings 111 are formed, in accordance with some embodiments. The openings 111 are formed extending through the dielectric layer 108 and the oxide layer 102B, and extend partially into the substrate 102C. The openings 111 may be formed by acceptable photolithography and etching techniques, such as by forming and patterning a photoresist and then performing an etching process using the patterned photoresist as an etching mask.

Figure 6:
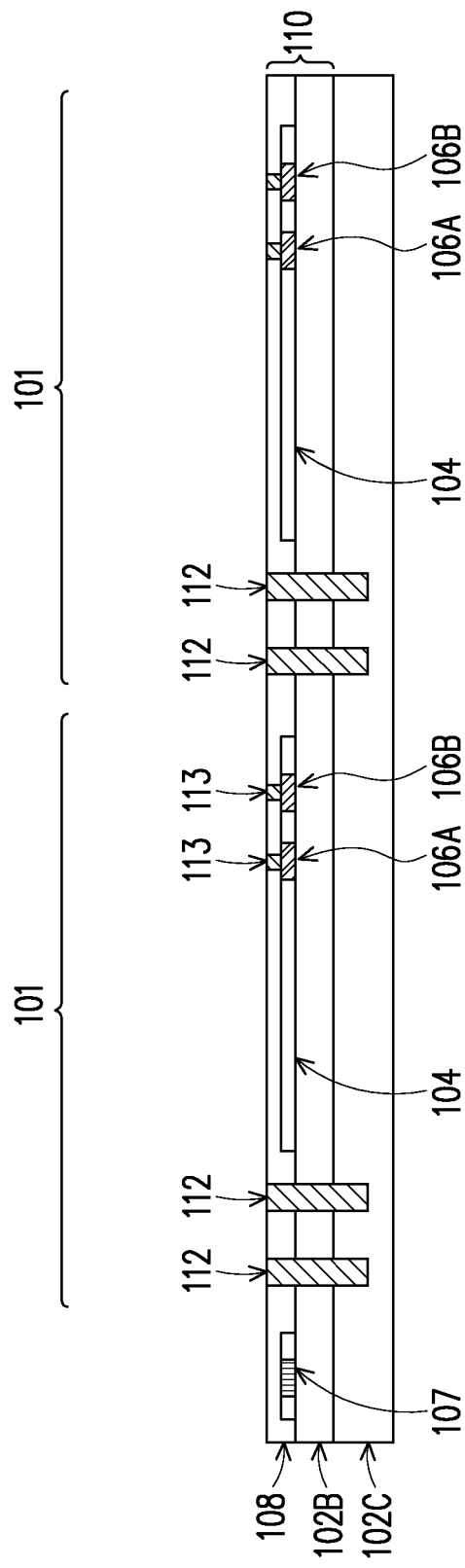

In FIG. 6, a conductive material is formed in the openings 111, thereby forming vias 112, in accordance with some embodiments. In some embodiments, a liner (not shown), such as a diffusion barrier layer, an adhesion layer, or the like, may be formed in the openings 111 from TaN, Ta, TiN, Ti, CoW, or the like, and may be formed using suitable a deposition process such as ALD or the like. In some embodiments, a seed layer (not shown), which may include copper or a copper alloy may then be deposited in the openings 111. The conductive material of the vias 112 is formed in the openings 111 using, for example, ECP or electro-less plating. The conductive material may include, for example, a metal or a metal alloy such as copper, silver, gold, tungsten, cobalt, aluminum, or alloys thereof. A planarization process, such as a CMP process or mechanical grinding may be performed to remove excess conductive material along the top surface of the dielectric layer 108, such that top surfaces of the vias 112 and the dielectric layer 108 are level.

FIG. 6 also shows the formation of contacts 113 that extend through the dielectric layer 108 to the photonic components 106. For example, the contacts 113 may make electrical connection to the photonic components 106. The contacts 113 allow electrical power and/or electrical signals to be transmitted to or from the photonic components 106. In this manner, the photonic components 106 may convert electrical signals (e.g., from an electronic die 140) into optical signals transmitted by the optical network 104, and/or convert optical signals from the optical network 104 into electrical signals (e.g., that may be received by an electronic die 140). The contacts 113 may be formed before or after formation of the vias 112, and the formation of the contacts 113 and the formation of the vias 112 may share some steps such as deposition of the conductive material or planarization. In some embodiments, the contact may be formed by a damascene process, e.g., dual damascene, single damascene, or the like. For example, in some embodiments, openings (not shown) for the contacts 113 are first formed in the oxide layer 108 using acceptable photolithography and etching techniques. A conductive material may then be formed in the openings, forming the contacts 113. The conductive material of the contacts 113 may be formed of a metal or a metal alloy including aluminum, copper, tungsten, or the like, which may be the same as that of the vias 112. The contacts 113 may be formed using other techniques or materials in other embodiments.

Figure 7:
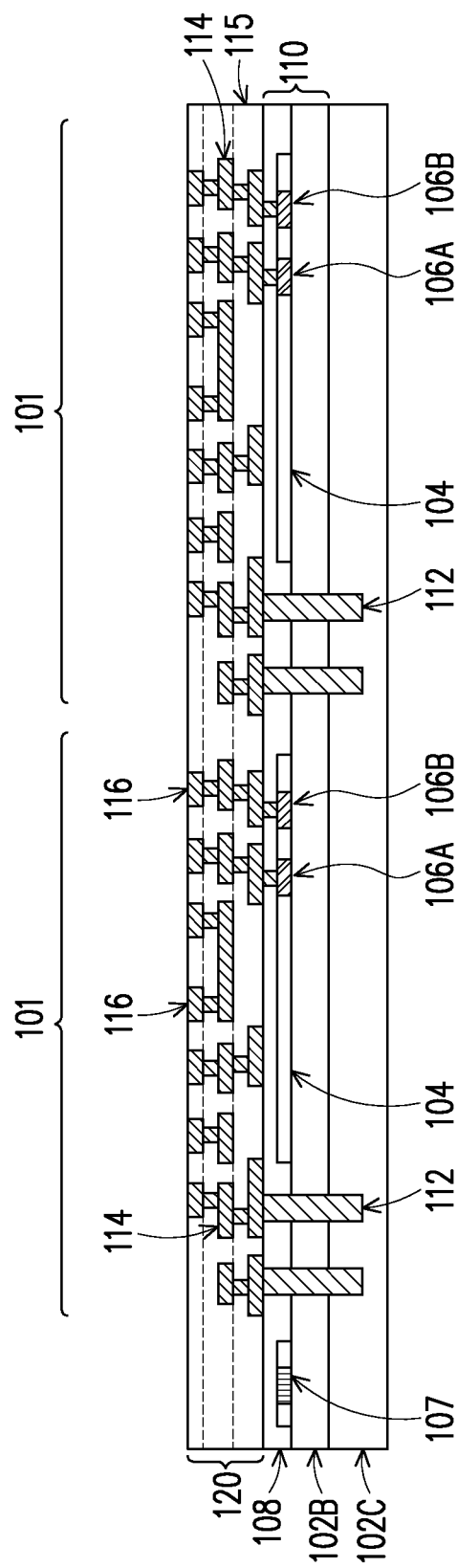

In FIG. 7, an interconnect structure 120 is formed over the dielectric layer 108, in accordance with some embodiments. The interconnect structure 120 includes dielectric layers 115 and conductive features 114 formed in the dielectric layers 115 that provide interconnections and electrical routing between the components of each site 101. The interconnect structure 120 may also provide interconnections and electrical routing between multiple sites 101, in some embodiments. For example, the interconnect structure 120 may connect the vias 112, the contacts 113 of the photonic components 106, and overlying site devices such as electronic dies 140, processing dies 142, and memory dies 144. The dielectric layers 115 may be, for example, insulating or passivating layers, and may include a material similar to those described above for the dielectric layer 108, such as a silicon oxide, or may include a different material. The dielectric layers 115 may be formed using a technique similar to those described above for the dielectric layer 108 or using a different technique. The conductive features 114 may include conductive lines and vias, and may be formed by a damascene process, e.g., dual damascene, single damascene, or the like. As shown in FIG. 7, conductive pads 116 are formed in the topmost layer of the dielectric layers 115. A planarization process (e.g., a CMP process or the like) may be performed after forming the conductive pads 116 such that surfaces of the conductive pads 116 and the topmost dielectric layer 115 are substantially coplanar. The interconnect structure 120 may include more or fewer dielectric layers 115, conductive features 114, or conductive pads 116 than shown in FIG. 7. The interconnect structure 120 may be formed having a thickness between about 4 µm and about 7 µm, in some embodiments.

In some embodiments, some regions of the interconnect structure 120 are substantially free of the conductive features 114 or conductive pads 116 in order to allow transmission of optical power or optical signals through the dielectric layers 115. For example, these regions may extend between a coupler 107 and a vertically mounted optical fiber 150A to allow optical power or optical signals to be coupled from the optical network 104 into the optical fiber 150 and/or to be coupled from the optical fiber 150 into the optical network 104. In some cases, a thinner interconnect structure 120 may allow for more efficient optical coupling between a coupler 107 and a vertically mounted optical fiber 150A.

Figure 8:
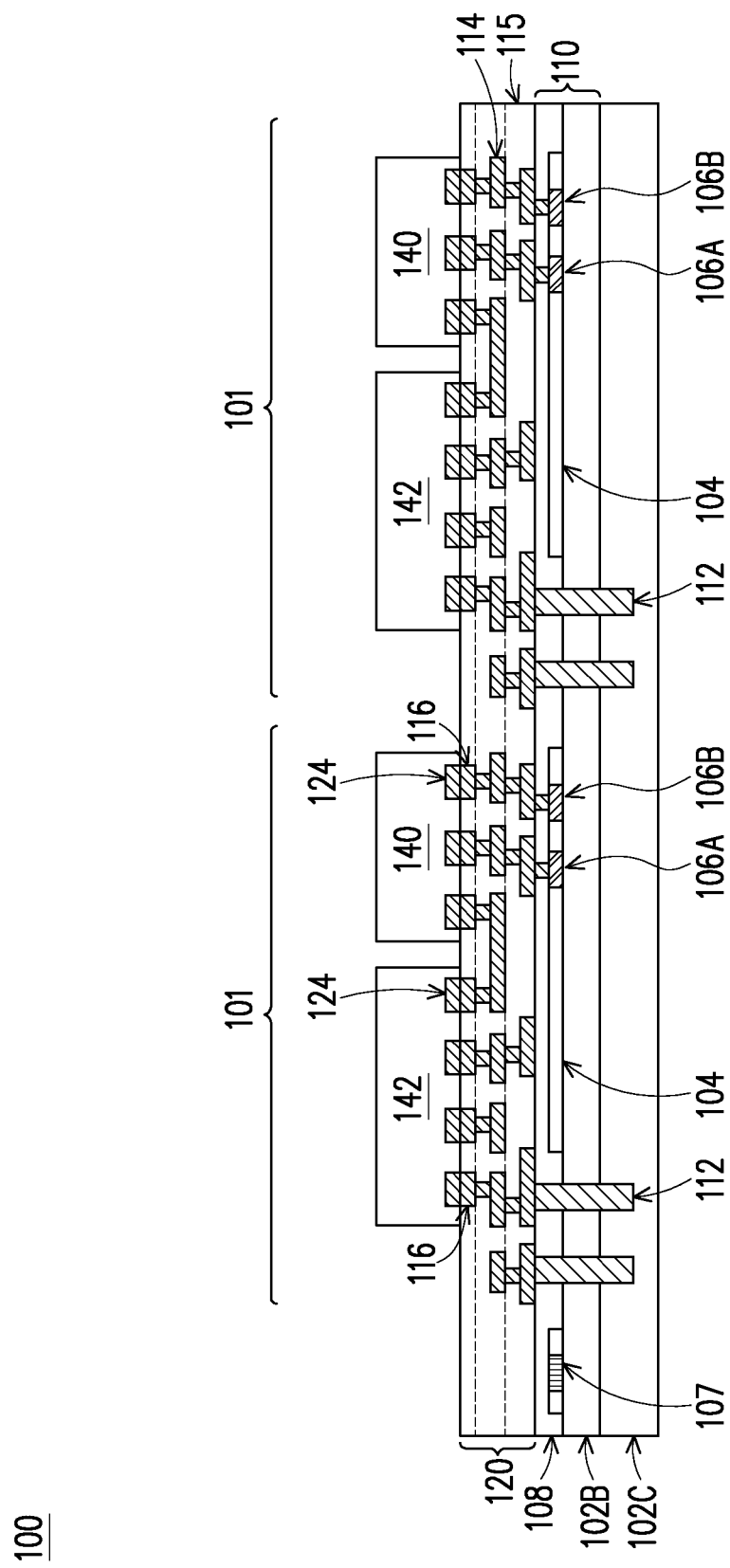

In FIG. 8, the site devices are bonded to the interconnect structure 120, in accordance with some embodiments. The site devices may include electronic dies 140, processing dies 142, and/or memory dies 144 as described previously. The cross-sectional view shown in FIG. 8 illustrates an electronic die 140 and a processing die 142 bonded to the interconnect structure 120 in each site 101, but the site devices of a site 101 may include one or more memory dies 144 or other devices. The electronic dies 140 and processing dies 142 shown in FIG. 8 include die connectors 124, which may be, for example, conductive pads, conductive pillars, or the like. In some embodiments, the devices (e.g., 140, 142, or 144) may have a thickness between about 10 µm and about 35 µm.

In some embodiments, the site devices (e.g., 140, 142, or 144) are bonded to the interconnect structure 120 by dielectric-to-dielectric bonding and/or metal-to-metal bonding (e.g., direct bonding, fusion bonding, oxide-to-oxide bonding, hybrid bonding, or the like). In such embodiments, covalent bonds may be formed between oxide layers, such as the topmost dielectric layers 115 and surface dielectric layers (not shown) of the site devices. During the bonding, metal bonding may also occur between the die connectors 124 of the site devices and the conductive pads 116 of the interconnect structure 120. The use of dielectric-to-dielectric bonding may allow for materials transparent to the relevant wavelengths of light (e.g., silicon oxide or the like) to be used (e.g., as the dielectric material 126 shown in FIG. 9) instead of opaque materials such as an encapsulant or a molding compound, allowing for optical signals to be transmitted vertically between a coupler 107 and a vertically mounted optical fiber 150A. Additionally, by bonding the site devices to the interconnect structure 120 in this manner, the thickness of the resulting PCS 100 may be reduced, and improved optical coupling between couplers 106 and vertically mounted optical fibers 150 may be achieved. In this manner, the size or processing costs of a high-speed computing system may be reduced, and the optical coupling to external components may be improved.

In some embodiments, before performing a dielectric-to-dielectric bonding process, a surface treatment is performed on the site devices (e.g., 140, 142, or 144) to activate surfaces. In some embodiments, the top surfaces of the interconnect structure 120 and/or the site devices may be activated utilizing, for example, a dry treatment, a wet treatment, a plasma treatment, exposure to an inert gas, exposure to $H_2$, exposure to $N_2$, exposure to $O_2$, the like, or combinations thereof. However, any suitable activation process may be utilized. After the activation process, the interconnect structure 120 and/or the site devices may be cleaned using, e.g., a chemical rinse. The site devices are then aligned with the interconnect structure 120 and placed into physical contact with the interconnect structure 120. The site devices may be placed on the interconnect structure 120 using a pick-and-place process, for example. The interconnect structure 120 and the site devices may then be subjected to a thermal treatment and/or pressed against each other (e.g., applying contact pressure) to bond the interconnect structure 120 and the site devices. For example, interconnect structure 120 and the site devices may be subjected to a pressure of about 200 kPa or less, and a temperature between about 200° C. and about 400° C. The interconnect structure 120 and the site devices may then be subjected to a temperature at or above the eutectic point of the material of the conductive pads 116 and the die connectors 124, e.g., between about 150° C. and about 650° C. to fuse the conductive pads 116 and the die connectors 124. In this manner, the dielectric-to-dielectric bonding and/or metal-to-metal bonding of interconnect structure 120 and the site devices forms a bonded structure. In some embodiments, the bonded structure is baked, annealed, pressed, or otherwise treated to strengthen or finalize the bonds.

Figure 9:
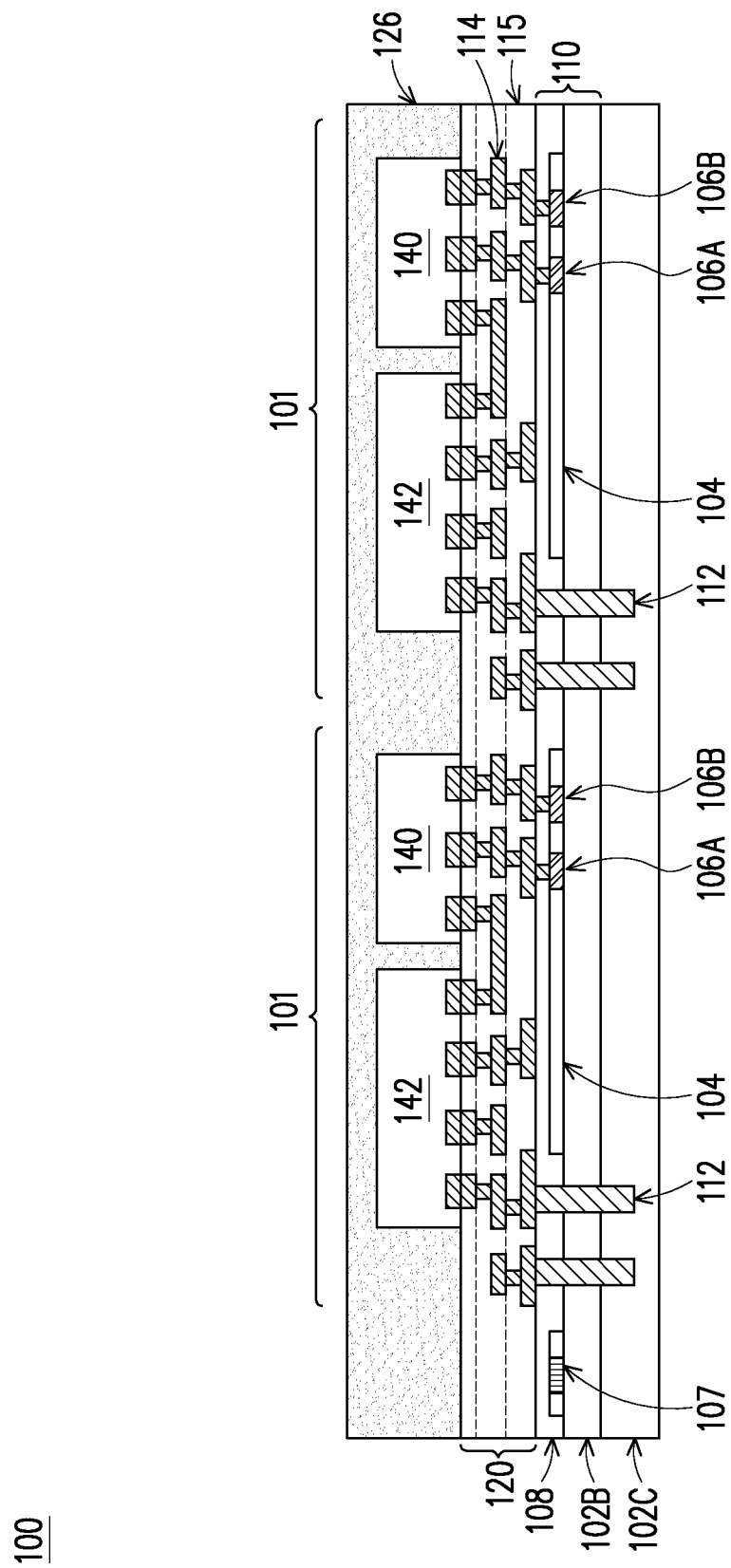

Turning to FIG. 9, a dielectric material 126 is formed over the site devices (e.g., 140, 142, or 144) and the interconnect structure 120, in accordance with some embodiments. The dielectric material 126 may be formed of silicon oxide, silicon nitride, polymer, the like, or a combination thereof. The dielectric material 126 may be formed by CVD, PVD, ALD, a spin-on-dielectric process, the like, or a combination thereof. In some embodiments, the dielectric material 126 may be formed by HDP-CVD, FCVD, the like, or a combination thereof. The dielectric material 126 may be a gap-fill material in some embodiments, which may include one or more of the example materials above. Other dielectric materials formed by any acceptable process may be used.

Figure 10:
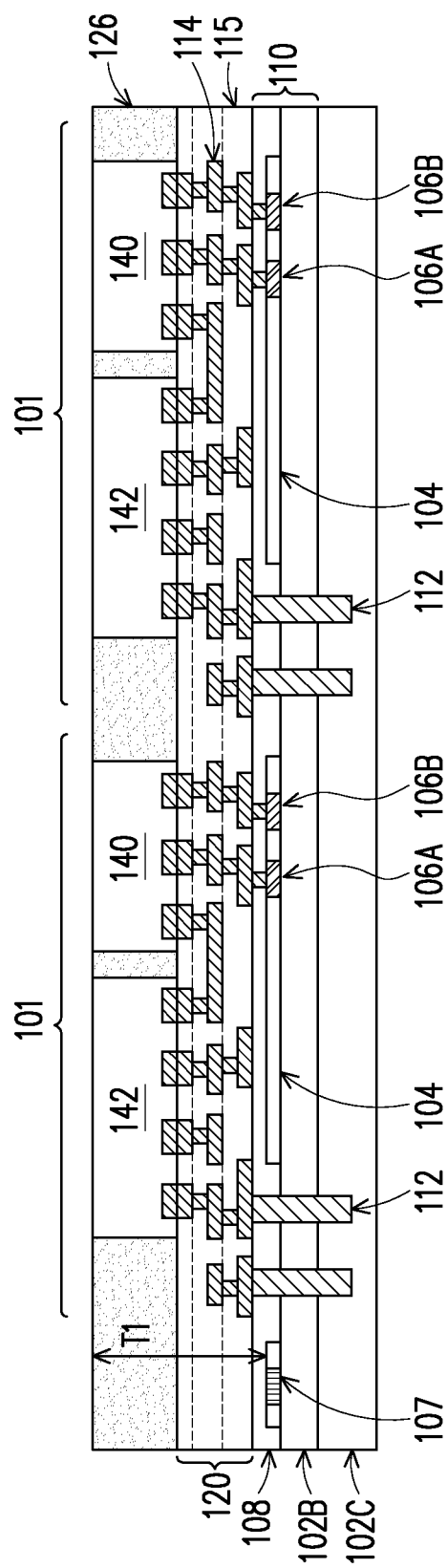

Turning to FIG. 10, the dielectric material 126 may be planarized, in accordance with some embodiments. The dielectric material 126 may be planarized using a suitable process such as a CMP process, a grinding process, or the like. The planarization process may expose the site devices (e.g., 140, 142, or 144) such that surfaces of the site devices and surfaces of the dielectric material 126 are coplanar. After planarization, the dielectric material 126 may have a thickness over the interconnect structure 120 that is between about 10 µm and about 40 µm. In some embodiments, the combined thickness T1 of the dielectric layer 108, the dielectric layers 115, and the dielectric material 126 over the optical network may be between about 14 µm and about 50 µm. In some cases, a smaller thickness T1 may allow for more efficient optical coupling between a coupler 107 and a vertically mounted optical fiber 150A. For example, in some embodiments, the thickness T1 may be less than about 30 µm.

Figure 11:
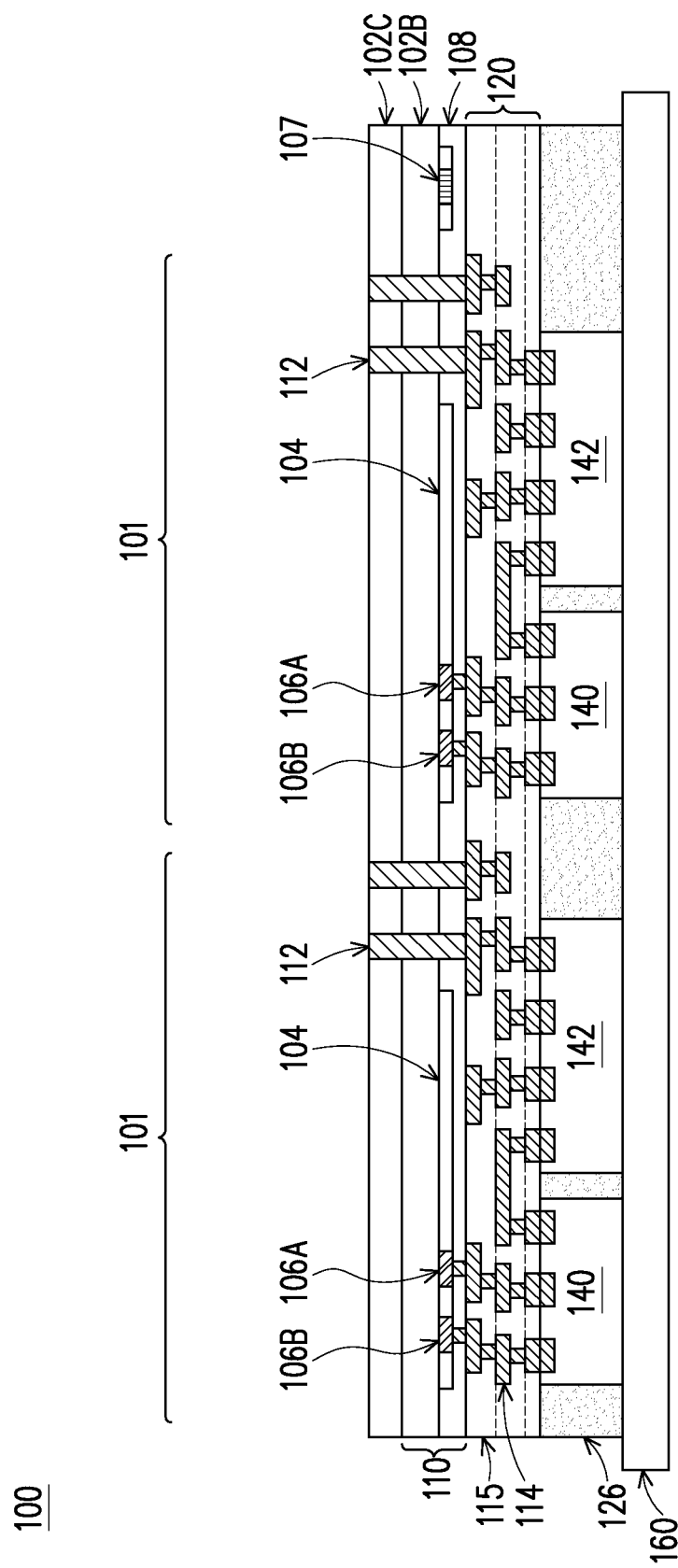

In FIG. 11, the front side of the structure is attached to a first carrier 160, in accordance with some embodiments. The first carrier 160 may be, for example, a wafer (e.g., a silicon wafer), a panel, a glass substrate, a ceramic substrate, or the like. The structure may be attached to the first carrier 160 using, for example, an adhesive or a release layer (not shown). As shown in FIG. 11, a planarization process (e.g., a CMP process or grinding process) may be performed to thin the back side of the substrate 102C and expose the vias 112.

Figure 12:
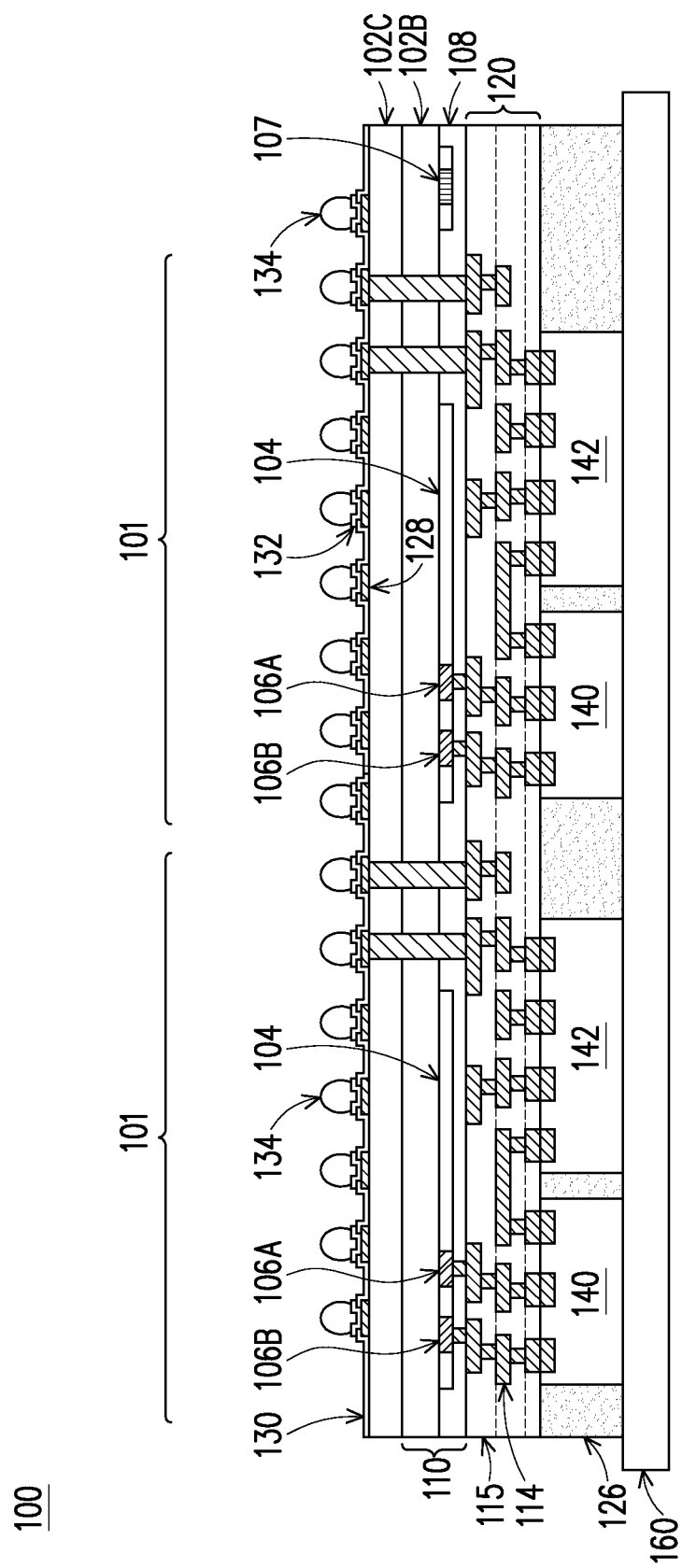

In FIG. 12, conductive pads 128 and conductive connectors 134 are formed on the exposed vias 112 and the substrate 102C, in accordance with some embodiments. In this manner, the photonic computing system (PCS) 100 may be formed. The conductive pads 128 are electrically connected to the interconnect structure 120 by the vias 112. The conductive pads 128 may be, for example, aluminum pads or aluminum-copper pads, although other metallic pads may be used. In some embodiments, a passivation film 130 may be formed on the substrate 102C, covering the conductive pads 128. The passivation film 130 may be formed from a dielectric material, such as silicon oxide, silicon nitride, the like, or combinations thereof. Openings may be formed through the passivation film 130 to expose central portions of the conductive pads 128. Underbump metallizations (UBMs) 132 may be formed on the conductive pads 128 and passivation film 130, in some embodiments. The UBMs 132 may be formed by, for example, forming a blanket conductive layer on the passivation film 130 and in the openings, such as by electroplating. The conductive layer may be formed from copper, a copper alloy, silver, gold, aluminum, nickel, the like, or combinations thereof. The conductive layer may be patterned to form the UBMs 132.

Still referring to FIG. 12, conductive connectors 134 are formed on the UBMs 132, in accordance with some embodiments. The conductive connectors 134 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 134 may include a conductive material such as solder, copper, aluminum, gold, nickel, silver, palladium, tin, the like, or a combination thereof. In some embodiments, the conductive connectors 134 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 134 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the conductive connectors 134. The metal cap layer may include nickel, tin, tin-lead, gold, silver, palladium, indium, nickel-palladium-gold, nickel-gold, the like, or a combination thereof and may be formed by a plating process.

Figure 13:
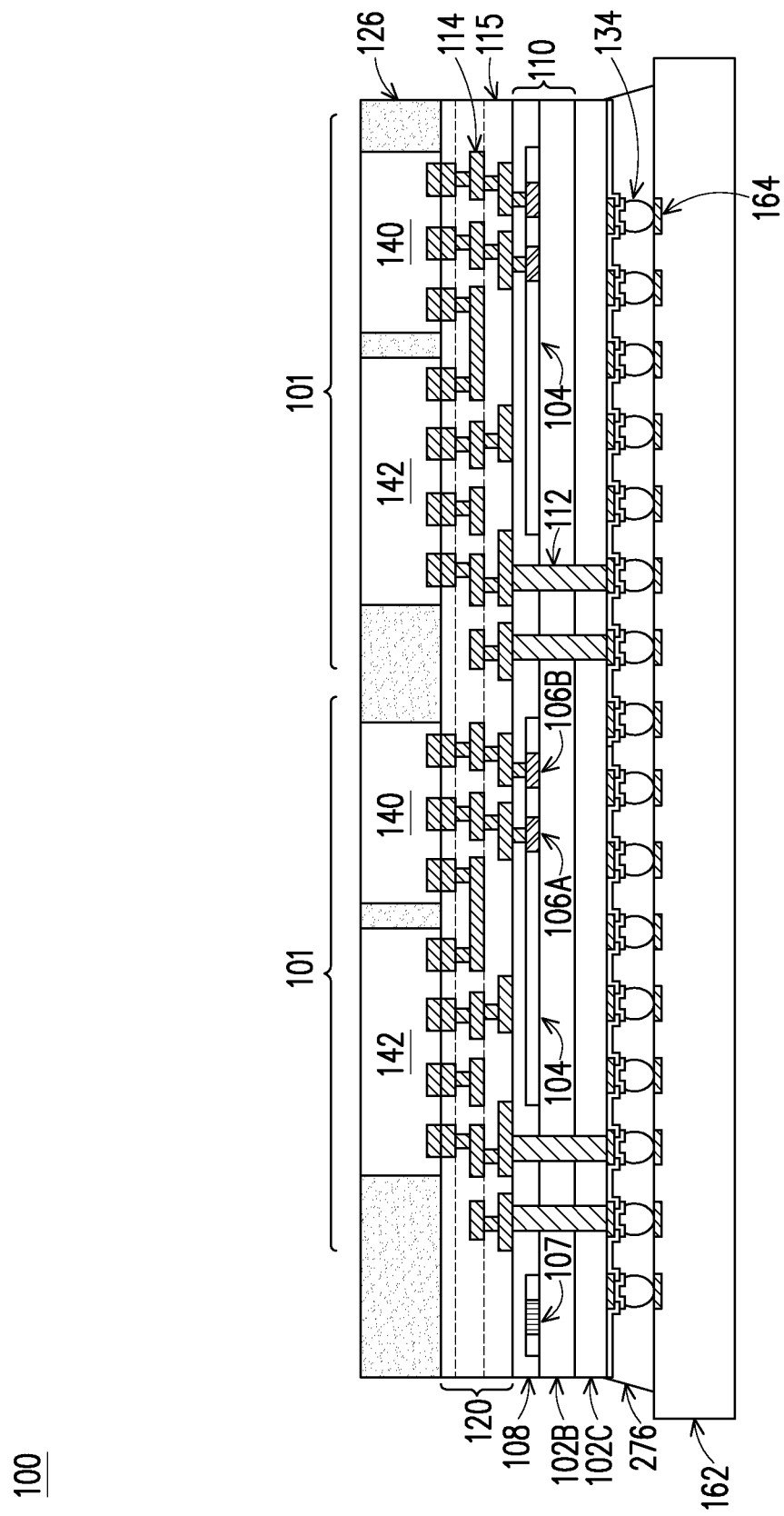

In FIG. 13, the first carrier 160 is removed and the PCS 100 is attached to an interconnect substrate 162, in accordance with some embodiments. The interconnect substrate 162 may be for example, a glass substrate, a ceramic substrate, a dielectric substrate, an organic substrate (e.g., an organic core), a semiconductor substrate (e.g., a semiconductor wafer), the like, or a combination thereof. In some embodiments, the interconnect substrate 162 includes conductive pads 164 and conductive routing (e.g., conductive lines, vias, redistribution structures, or the like) that is electrically connected the conductive pads 164. The interconnect substrate 162 may include passive or active devices, in some embodiments.

The PCS 100 may be connected to the interconnect substrate 162, for example, by bonding the conductive connectors 134 of the PCS 100 to the conductive pads 164 of the interconnect substrate 162. In some embodiments, the conductive connectors 134 may be aligned with corresponding conductive pads 164 and then placed in physical contact with the conductive pads 164. In some embodiments, once the conductive connectors 134 are in physical contact with the conductive pads 164, a reflow process may be performed to bond the material of the conductive connectors 134 to the conductive pads 164 and thus attach the PCS 100 to the interconnect substrate 162. In some embodiments, an underfill 166 may be formed between the PCS 100 and the interconnect substrate 162. In some embodiments, the interconnect substrate 162 may be another type of structure, such as an integrated fan-out structure, a redistribution structure, or the like. In some embodiments, the interconnect substrate 162 may be considered part of the PCS 100.

Figure 14:
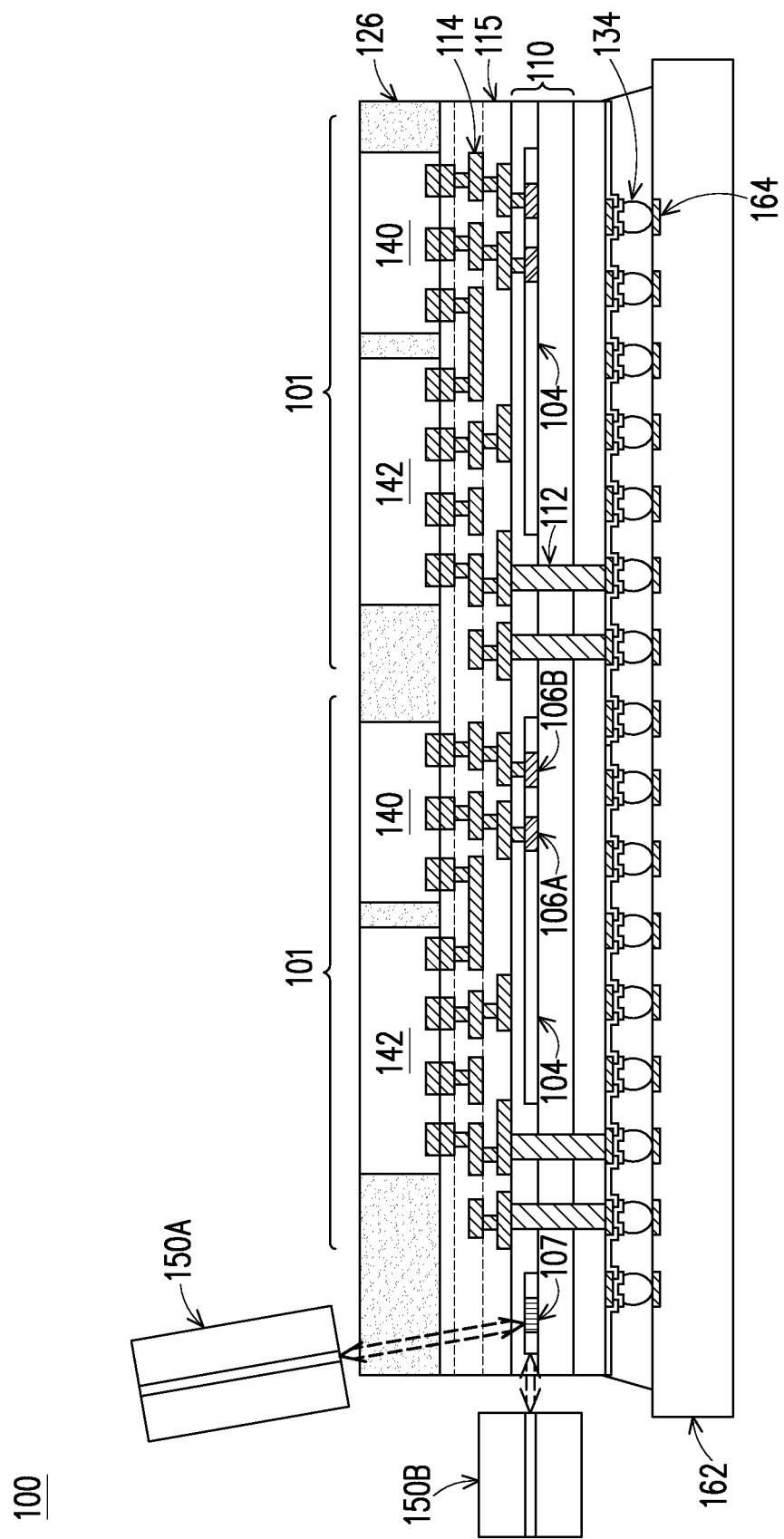

FIG. 14 illustrates optical fibers 150A-B coupled to the PCS 100, in accordance with some embodiments. Only one optical fiber 150 may be coupled to the PCS 100, or more than one optical fiber 150 may be coupled to the PCS 100. FIG. 14 illustrates both a vertically mounted optical fiber 150A and a horizontally mounted optical fiber 150B as illustrative examples, but embodiments may include multiple optical fibers 150 mounted in the same orientation or may include multiple optical fibers 150 mounted in multiple orientations. The optical fiber 150 may be mounted using an optical glue (not shown in the Figures) or the like.

In some embodiments, a vertically mounted optical fiber 150A may be optically coupled to the optical network 104 of the PCS 100 by a coupler 107 comprising a grating coupler. In some embodiments, the vertically mounted optical fiber 150A may be mounted at an angle with respect to the vertical axis or may be laterally offset from the coupler 107. Couplers 107 for vertically mounted optical fibers 150A may be located near the edges of the PCS 100 and/or away from the edges of the PCS 100. The optical signals and/or optical power transmitted between the vertically mounted optical fiber 150A and the coupler 107 are transmitted through the dielectric layer 108, the dielectric layers 115, and the dielectric material 126 formed over the coupler 107. For example, optical power may be transmitted from the vertically mounted optical fiber 150A to the coupler 107 and into the optical network 104, wherein the optical power may be modulated by a modulator 106B and transmitted as optical signals within the optical network 104. Mounting the optical fiber 150 in a vertical orientation may allow for improved optical coupling, reduced processing cost, or greater design flexibility.

In some embodiments, a horizontally mounted optical fiber 150B may be optically coupled to the optical network 104 of the PCS 100 by a coupler 107 comprising an edge coupler. In some embodiments, the horizontally mounted optical fiber 150B may be mounted at an angle with respect to the horizontal axis or may be vertically offset from the coupler 107. Couplers 107 for horizontally mounted optical fibers 150B may be located near the edges of the PCS 100. The optical signals and/or optical power transmitted between the horizontally mounted optical fiber 150B and the coupler 107 are transmitted through the dielectric material 126. For example, optical power may be transmitted from the horizontally mounted optical fiber 150B to the coupler 107 and into the optical network 104, wherein the optical power may be modulated by a modulator 106B and transmitted as optical signals within the optical network 104. In this manner, a PCS 100 as described herein may be coupled to optical fibers 150 in different configurations, allowing for greater flexibility of design.

FIGS. 15 through 20 show cross-sectional views of intermediate steps of forming a photonic computing system (PCS) 200 (see FIG. 20), in accordance with some embodiments. In FIGS. 15 through 19, regions are labeled in which two individual sites 201 of the PCS 200 are subsequently formed. The PCS 200 is similar to the PCS 100 described for FIGS. 1A-B through 14, except that each site 201 includes stacked site devices (e.g., 240, 242, 250, or 252, described in greater detail below). For example, second site devices (e.g., 250, 252) may be connected to first site devices (e.g., 240, 242). In some cases, one or more site devices may be thick enough that a correspondingly thick dielectric material 126 would reduce the efficiency of optical coupling between a grating coupler 107 and a vertically mounted optical fiber 150A (see FIG. 19). For example, the efficiency of the optical coupling may be reduced if the thickness T1 (see FIGS. 10, 20) is greater than about 30 µm, in some cases. By attaching relatively thick site devices on relatively thin site devices in a stacked configuration, the thickness of the dielectric material 126 may be kept suitably thin to allow efficient optical coupling to a vertically mounted optical fiber 150A.

Figure 15:
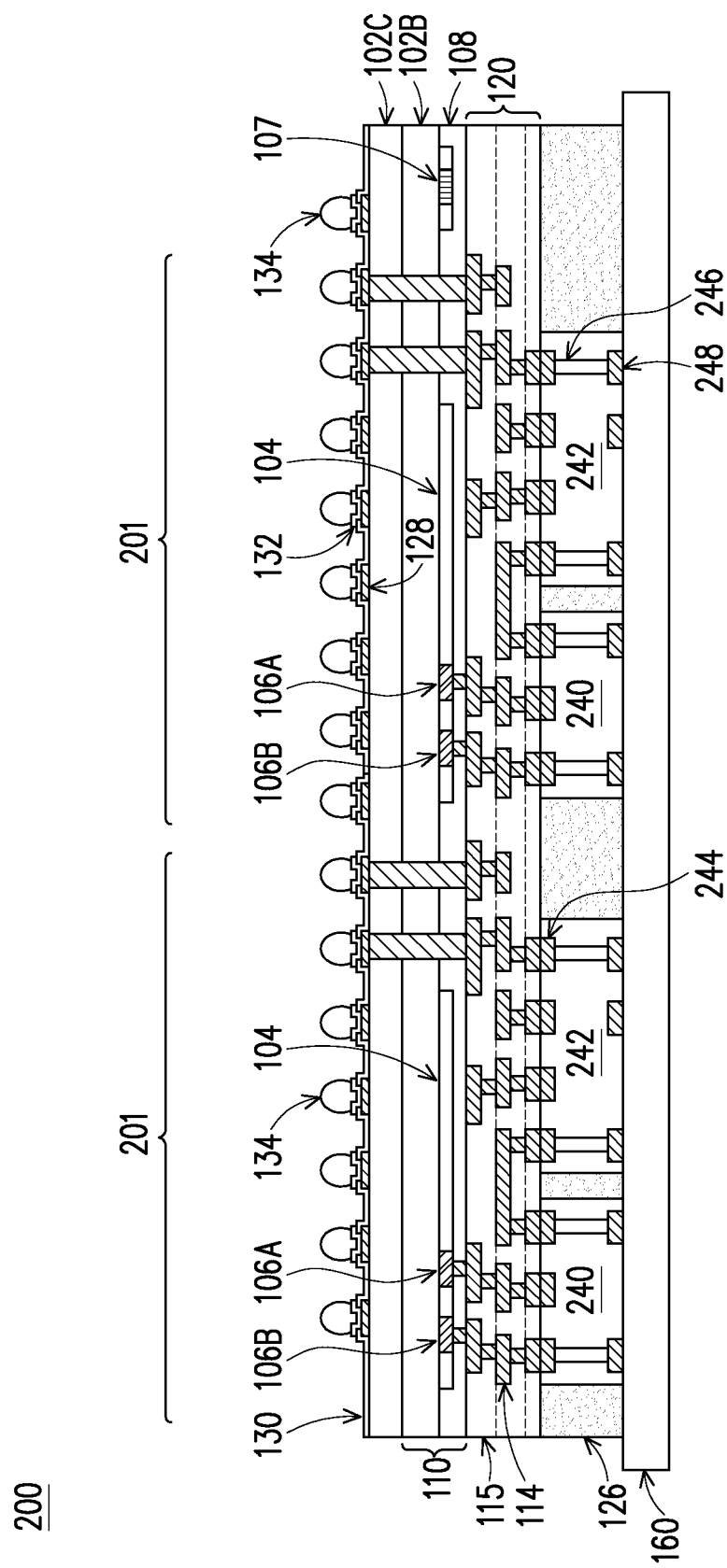
FIGS. 15 through 20 illustrate cross-sectional views of intermediate steps of forming a photonic computing system having stacked devices, in accordance with some embodiments.

FIG. 15 shows an intermediate step of the formation of the PCS 200 after first site devices (e.g., 240, 242) have been attached to the interconnect structure 120. The structure shown in FIG. 15 may be formed in a similar manner as described for the PCS 100 in FIGS. 2 through 12. For example, FIG. 15 shows the structure after conductive connectors 134 have been formed, similar to the structure shown in FIG. 12.

As shown in FIG. 15, first site devices (e.g., 240, 242) have been bonded to the interconnect structure 120. The first site devices may be bonded to the interconnect structure 120 in a manner similar to that described for the site devices (e.g., 140, 142) of the PCS 100 in FIG. 8. For example, the first site devices may include conductive pads 244 that are bonded to conductive pads 116 of the interconnect structure 120. The first site devices (e.g., 240, 242) of the PCS 200 may be similar to the site devices (e.g., 140, 142) of the PCS 100, except that the first site devices of the PCS 200 may include through vias 246 and/or contact pads 248. The contact pads 248 may be used to form electrical connections with second site devices (e.g., 250, 252) of the PCS 200. The through vias 246 may be electrically connected to the conductive pads 244, the contact pads 248, or to other features of the first site device such as integrated circuits, conductive routing, or the like. In some embodiments, the first site devices of the PCS 200 may include an electronic die 240 that is similar to the electronic die 140 of the PCS 100, a processing die 242 that is similar to the processing die 142 of the PCS 100, a memory die (not shown in FIG. 15), or other types of devices or dies.

Figure 16:
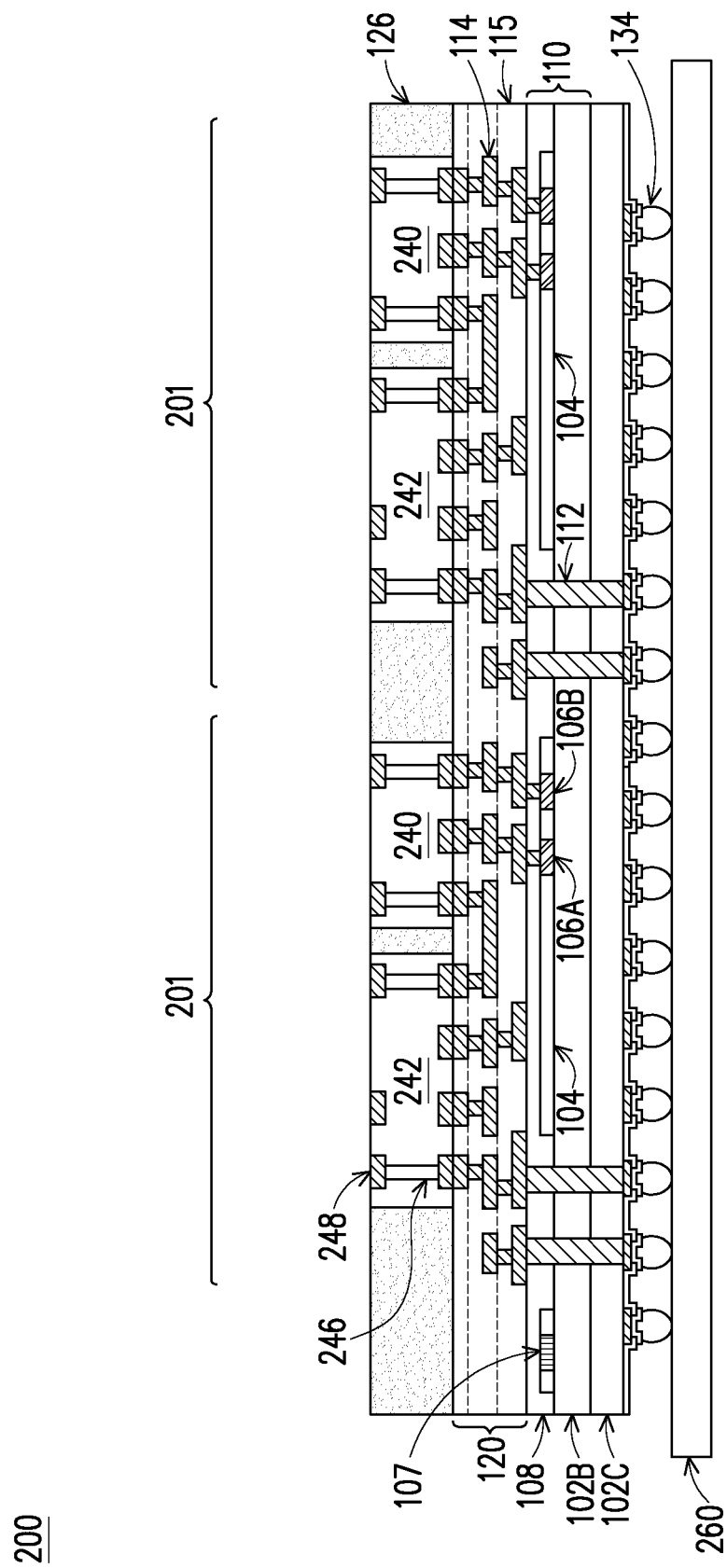

In FIG. 16, the first carrier 160 is removed and the structure is flipped over and attached to a second carrier 260, in accordance with some embodiments. The second carrier 260 may be, for example, a wafer (e.g., a silicon wafer), a panel, a glass substrate, a ceramic substrate, or the like, and may be similar to the first carrier 160.

Figure 17:
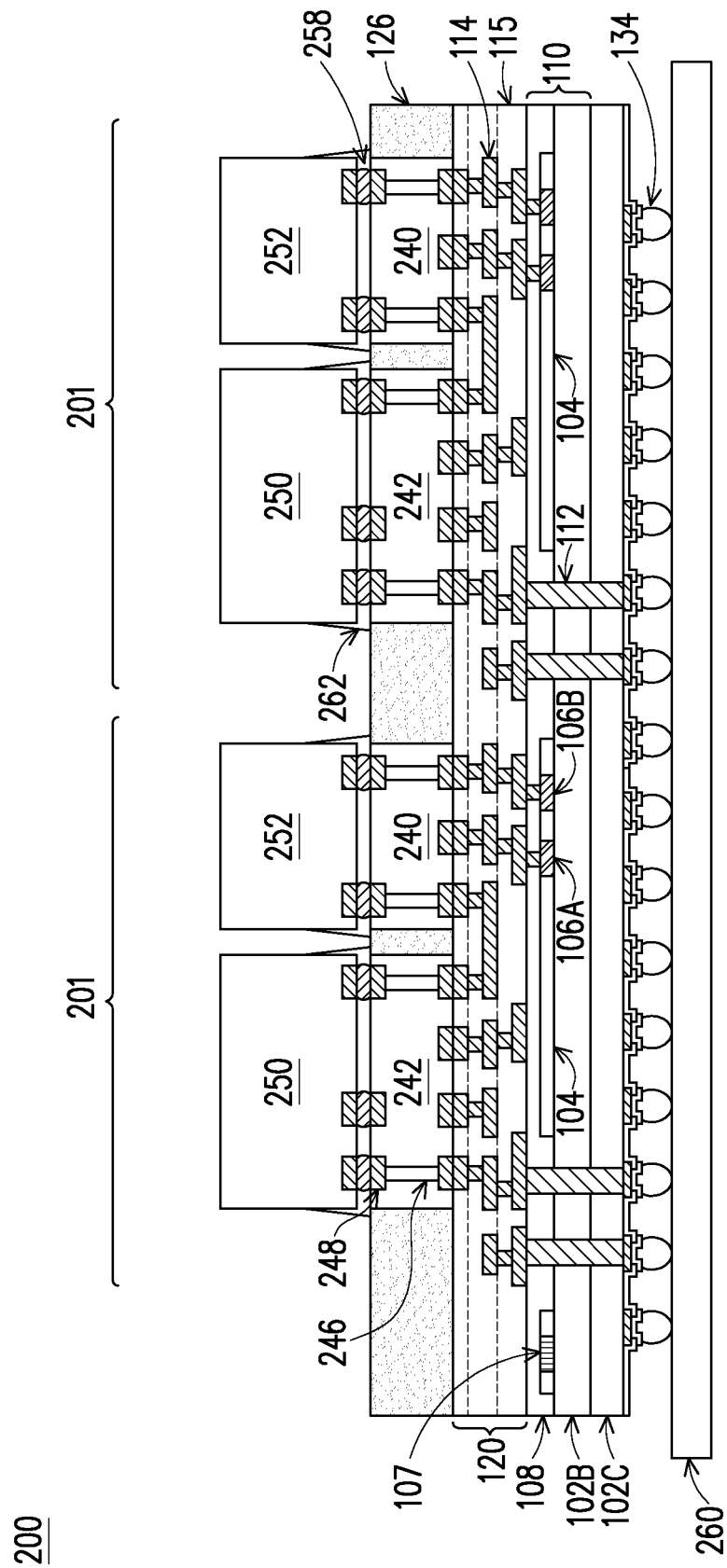

In FIG. 17, the second site devices (e.g., 250, 252) are attached to the first site devices (e.g., 240, 242). In some embodiments, the second site devices of the PCS 200 may include, for example, a memory die 250 that is similar to the memory die 144 of the PCS 100, or other types of devices or dies. For example, the memory die 250 may be a stacked memory die, a high-bandwidth memory (HBM) die, a DRAM die, or the like. In some embodiments, the second site devices may include a dummy die 252, which may be attached to a first device die to improve planarity of the subsequently formed molding material 264 (see FIG. 19). As shown in FIG. 17, one or more of the second site devices may have a thickness greater than the first site devices. In some embodiments, a second site device may have a thickness between about 100 µm and about 700 µm.

As shown in FIG. 17, a memory die 250 may be attached to a processing die 242 and a dummy die 252 may be attached to an electronic die 240. The second site devices may be attached to other first site devices than shown, or may be attached to the first site devices in a different configuration or different arrangement than shown. In some embodiments, the second site devices may be attached to the first site devices using conductive connectors 258 such as solder balls, micro bumps, or the like. An underfill 262 may be formed between the second site devices and the first site devices. The use of stacked site devices as described allows for dies of various sizes and thicknesses to be used in a PCS 200 while still allowing optical coupling to a vertically mounted optical fiber 150A (see FIG. 20).

Figure 18:
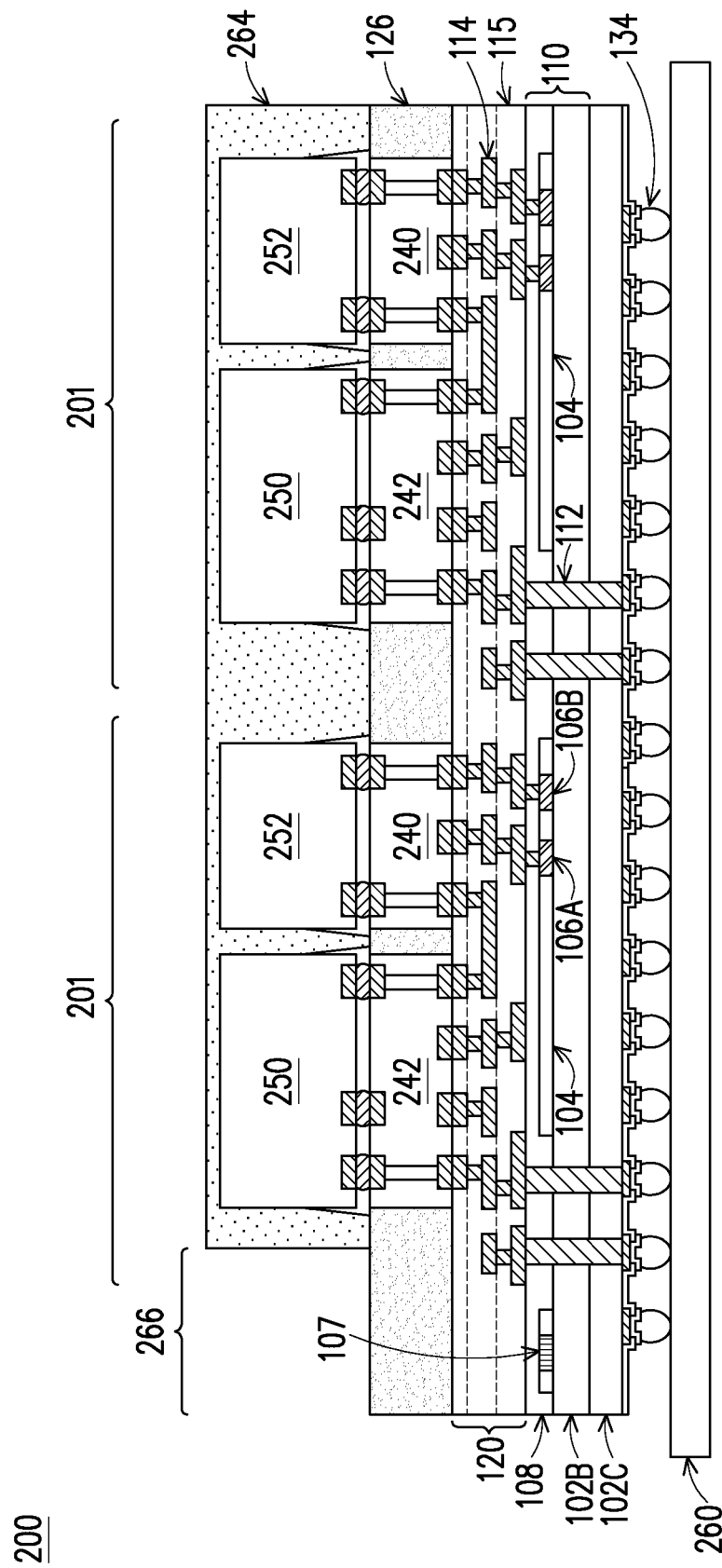

In FIG. 18, a molding material 264 is formed over the second site devices (e.g., 250, 252). In some embodiments, the molding material 264 may be an epoxy, resin, molding compound, or the like, and may be applied to the structure in a laminate or sheet form. For example, a sheet of the molding material 264 may be pressed onto the structure using a compression technique or the like. A curing process may be performed after applying the molding material 264, which may include subjecting the molding material 264 to elevated temperature or pressure.

In some embodiments, regions of a sheet of molding material 264 may be removed prior to application, forming corresponding cut-out regions 266 of the PCS 200 after application of the molding material 264. The cut-out regions 266 of the PCS 200 include regions of the dielectric layer material 126 that are free of molding material 264. In this manner, optical signals transmitted through the dielectric material 126 within the cut-out regions 266 are not blocked by the molding material 264. Thus, a vertically mounted optical fiber 150A may be optically coupled to a grating coupler 107 of the PCS 200 in a cut-out region 266, shown below in FIG. 20. The use of a molding material 264 having cut-out regions 266 allows for stacked site devices to be used in a PCS 200 while still allowing optical coupling to vertically mounted optical fibers 150A (see FIG. 20). In some embodiments, the PCS 200 may not have cut-out regions 266, for example, in embodiments not configured for vertically mounted optical fibers 150A.

Figure 19:
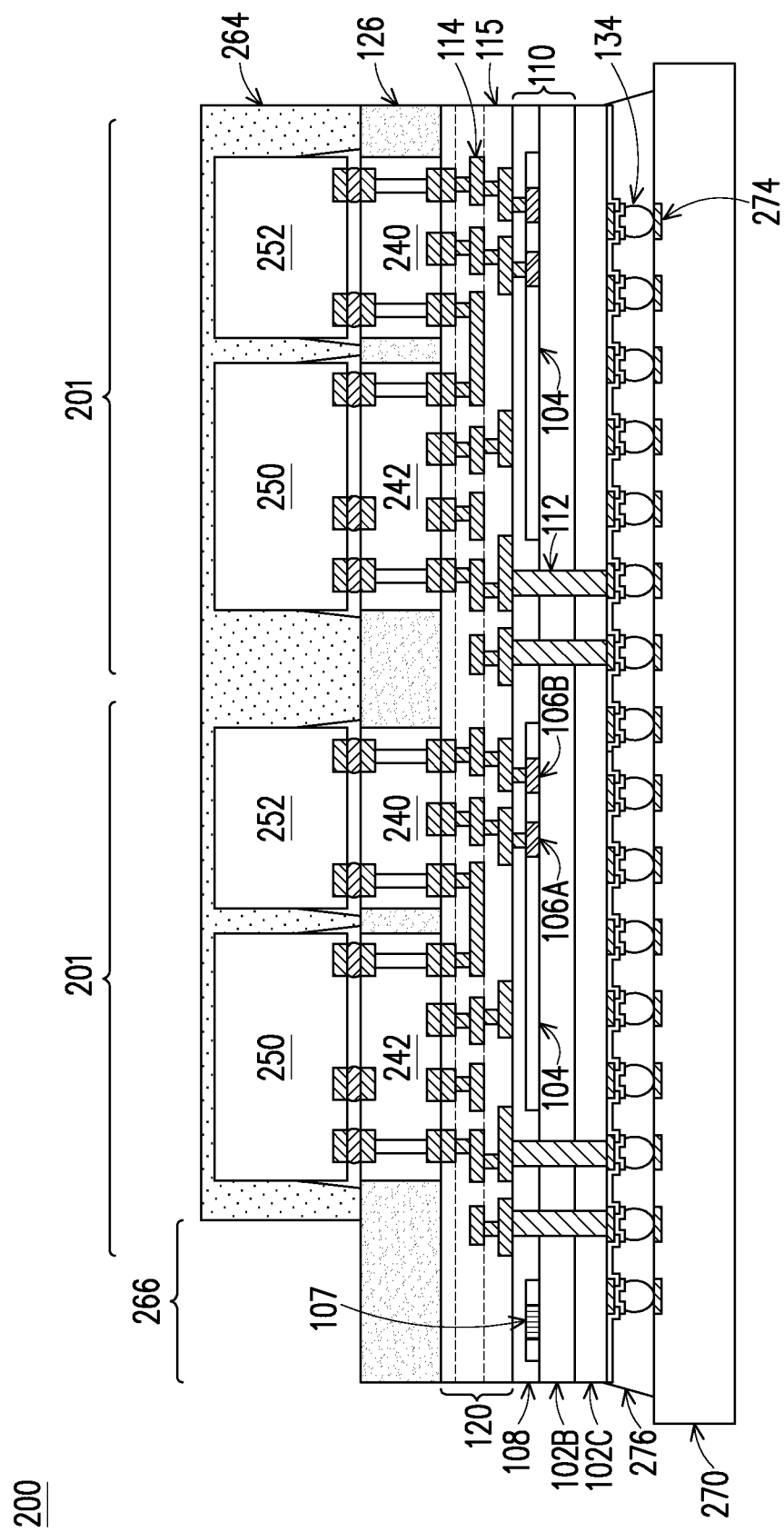

In FIG. 19, the second carrier 260 is removed and the PCS 200 is attached to an interconnect substrate 270, in accordance with some embodiments. The interconnect substrate 270 may be similar to the interconnect substrate 162 described for FIG. 13. The interconnect substrate 270 may include conductive pads 274 and conductive routing (e.g., conductive lines, vias, redistribution structures, or the like) that is electrically connected the conductive pads 274. The interconnect substrate 270 may include passive or active devices, in some embodiments. The PCS 200 may be connected to the interconnect substrate 270, for example, by bonding the conductive connectors 134 of the PCS 200 to the conductive pads 274 of the interconnect substrate 270.

Figure 20:
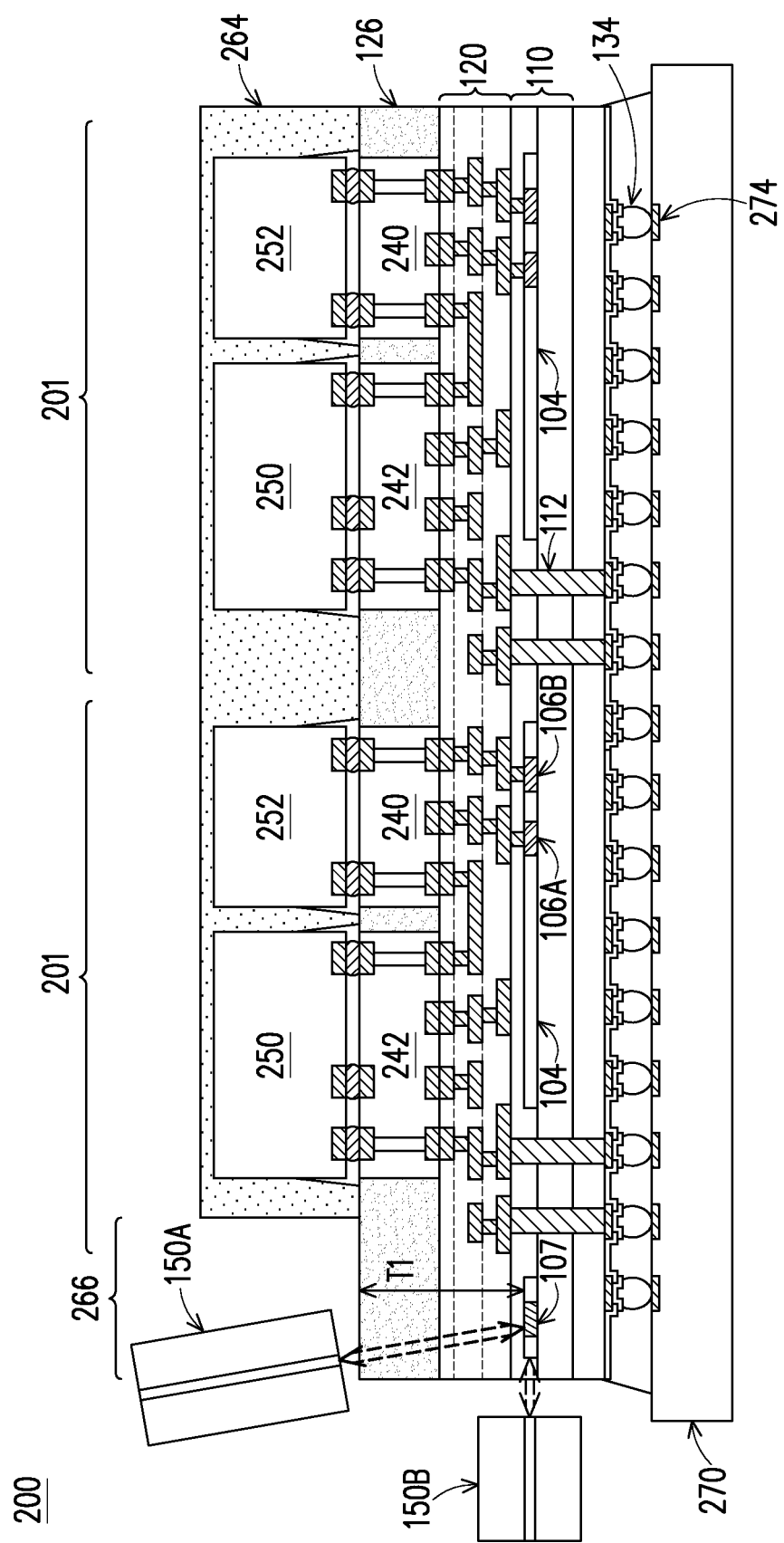

FIG. 20 illustrates optical fibers 150A-B coupled to the PCS 200, in accordance with some embodiments. Only one optical fiber 150 may be coupled to the PCS 200, or more than one optical fiber 150 may be coupled to the PCS 200. FIG. 20 illustrates both a vertically mounted optical fiber 150A and a horizontally mounted optical fiber 150B as illustrative examples, but embodiments may include multiple optical fibers 150 mounted in the same orientation or may include multiple optical fibers 150 mounted in multiple orientations. The optical fiber 150 may be mounted using an optical glue or the like.

In some embodiments, a vertically mounted optical fiber 150A may be optically coupled to the optical network 104 of the PCS 200 by a coupler 107 comprising a grating coupler. The vertically mounted optical fiber 150A and the corresponding coupler 107 may be located at or near a cut-out region 266 such that the optical signals and/or optical power transmitted between the vertically mounted optical fiber 150A and the coupler 107 are transmitted through the dielectric layer 108, the dielectric layers 115, and the dielectric material 126 within the cut-out region 266. The use of a PCS 200 having cut-out regions 266 without molding material 264 as described herein allows for optical coupling using vertically mounted optical fibers 150A, which can allow for improved optical coupling, reduced processing cost, or greater design flexibility.

In some embodiments, a horizontally mounted optical fiber 150B may be optically coupled to the optical network 104 of the PCS 200 by a coupler 107 comprising an edge coupler. Couplers 107 for horizontally mounted optical fibers 150B may be located near the edges of the PCS 100, which may or may not be in or near a cut-out region 266. The optical signals and/or optical power transmitted between the horizontally mounted optical fiber 150B and the coupler 107 are transmitted through the dielectric material 126. In this manner, a PCS 200 as described herein may be coupled to optical fibers 150 in different configurations, allowing for greater flexibility of design.

Embodiments may achieve advantages. The embodiments described herein allow for an optical coupling to a computing site to be formed with less cost and improved operation. For example, by hybrid bonding dies to a photonic routing structure, an optical fiber may be mounted vertically. This allows for improved optical coupling to an optical fiber. The dies may be stacked to allow for thicker dies, and a sheet molding material may be used, with regions of the molding material removed to allow communication with vertically mounted optical fibers. Additionally, electronic dies are used as an efficient "optical I/O interface" between optical communications components and processing dies. For example, the electronic dies can serve as the optical I/O interface for computing sites of a photonic computing system that provides optical communication between the computing sites using the photonic routing structure. In some cases, high speed SerDes devices may be integrated with photonics devices while having flexible and efficient optical fiber attachment, which includes in both vertical or edge optical fiber connections. In some cases, the use of a photonic routing structure to optically connect computing sites can allow increased device performance in, e.g., HPC applications that include many interconnected computer systems. Transmitting optical signals between computing sites may have less signal attenuation at high frequencies, lower crosstalk, and less switching noise than transmitting electrical signals with e.g., conductive lines and the like. Optical communication may allow for lower-latency and higher-bandwidth communication between some of the sites. The photonic computing system described herein can provide a low power, high bandwidth, yet scalable interconnection network suitable for extreme large parallel computation applications.

In accordance with an embodiment, a device includes a photonic routing structure including a silicon waveguide, photonic devices, and a grating coupler, wherein the silicon waveguide is optically coupled to the photonic devices and to the grating coupler; an interconnect structure on the photonic routing structure, wherein the grating coupler is configured to optically couple to an external optical fiber disposed over the interconnect structure; and computing sites on the interconnect structure, wherein each computing site includes an electronic die bonded to the interconnect structure, wherein each electronic die of the computing sites is electrically connected to a corresponding photonic device of the photonic devices. In an embodiment, the photonic routing structure further includes an edge coupler that is optically coupled to the silicon waveguide, wherein the edge coupler is configured to optically couple to an external optical fiber mounted adjacent a sidewall of the photonic routing structure. In an embodiment, the photonic devices include photodetectors and optical modulators. In an embodiment, each computing site includes a processing die bonded to the interconnect structure, wherein each processing die of the computing sites is electrically connected to an electronic die by the interconnect structure. In an embodiment, each computing site includes a memory die bonded to a processing die. In an embodiment, the electronic die is hybrid bonded to the interconnect structure. In an embodiment, the device includes a molding material over the interconnect structure, wherein a region directly over the grating coupler is free of the molding material.

In accordance with an embodiment, a system includes a waveguide on a first dielectric layer; photodetectors on the first dielectric layer; a grating coupler on the first dielectric layer; a second dielectric layer over the first dielectric layer; a through via extending through the first dielectric layer and the second dielectric layer; an interconnect structure on the second dielectric layer, wherein the interconnect structure is connected to the through via and to the photodetectors; electronic dies connected to the interconnect structure, wherein the electronic dies are communicatively connected to the photodetectors; and processing dies connected to the interconnect structure, wherein the processing dies are communicatively connected to the electronic dies. In an embodiment, the electronic dies are configured to receive first electrical signals from the photodetectors and transmit second electrical signals to the processing dies, wherein the second electrical signals are based on the first electrical signals. In an embodiment, the system includes optical modulators on the first dielectric layer, wherein the electronic dies are configured to receive third electrical signals from the processing dies and transmit fourth electrical signals to the optical modulators, wherein the fourth electrical signals are based on the third electrical signals. In an embodiment, the electronic dies are hybrid bonded to the interconnect structure. In an embodiment, the grating coupler is configured to receive optical power from an optical fiber located over the grating coupler, and wherein the grating coupler is configured to couple the optical power into the waveguide. In an embodiment, the system includes a third dielectric layer over the interconnect structure, wherein the electronic dies and the processing dies are within the third dielectric layer. In an embodiment, the through via is attached to an interconnect substrate by a conductive connector. In an embodiment, the waveguide is a closed loop, and the waveguide is optically coupled to each photodetector.

In accordance with an embodiment, a method includes patterning a silicon layer to form a waveguide; forming photonic components in the waveguide; forming a grating coupler in the waveguide; forming an interconnect structure over the waveguide and the photonic components, wherein the interconnect structure is connected to the photonic components; forming computing sites on the interconnect structure, wherein forming each computing site includes bonding a first semiconductor device to the interconnect structure using a hybrid bonding process, wherein the first semiconductor device of each computing site is electrically connected through the interconnect structure to at least one photonic component; and forming a dielectric layer on the interconnect structure and surrounding the first semiconductor devices of the computing sites. In an embodiment, the method includes attaching an optical fiber to the dielectric layer, wherein the optical fiber is optically coupled to the grating coupler through the dielectric layer. In an embodiment, the photonic components include at least one photodetector and at least one optical modulator. In an embodiment, forming each computing site includes attaching a second semiconductor device to the first semiconductor device. In an embodiment, the method includes removing a region of a sheet of molding material and applying to the sheet of molding material to the dielectric layer and to the first semiconductor device of each computing site, wherein the removed region of the sheet of molding material is aligned over the grating coupler after applying the sheet of molding material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   patterning a silicon layer to form a waveguide;
   forming a plurality of photonic components in the waveguide;
   forming a grating coupler in the waveguide;
   forming an interconnect structure over the waveguide and the plurality of photonic components, wherein the interconnect structure is electrically connected to the plurality of photonic components;
   forming a plurality of computing sites on the interconnect structure, wherein forming each computing site of the plurality of computing sites comprises directly bonding a first semiconductor device to the interconnect structure, wherein the first semiconductor device of each computing site is electrically connected through the interconnect structure to at least one photonic component of the plurality of photonic components;
   forming a dielectric layer on the interconnect structure and surrounding the first semiconductor devices of the plurality of computing sites; and
   performing a planarization process on the dielectric layer, wherein top surfaces of the dielectric layer and top surfaces of the first semiconductor devices are level after performing the planarization process.

2. The method of claim 1, further comprising attaching an optical fiber to the dielectric layer, wherein the optical fiber is optically coupled to the grating coupler through the interconnect structure and the dielectric layer.

3. The method of claim 1, wherein forming each computing site of the plurality of computing sites further comprises attaching a respective second semiconductor device to the first semiconductor device.

4. The method of claim 3 further comprising encapsulating the second semiconductor devices with an encapsulant.

5. The method of claim 3, wherein at least one respective second semiconductor device is a dummy device.

6. The method of claim 1, further comprising:
   removing a region of a sheet of molding material to form a cut-out region in the sheet of molding material; and
   applying the sheet of molding material to the dielectric layer, wherein the cut-out region in the sheet of molding material is aligned over the grating coupler after applying the sheet of molding material.

7. The method of claim 1, wherein directly bonding the first semiconductor device to the interconnect structure comprises a dielectric-to-dielectric bonding process.

8. The method of claim 1 further comprising forming an edge coupler in the waveguide.

9. The method of claim 1, wherein the dielectric layer and the first semiconductor devices have a same thickness after performing the planarization process.

10. A method comprising:
- forming a photonic routing structure comprising a silicon waveguide and a plurality of photonic devices, wherein the silicon waveguide is optically coupled to the plurality of photonic devices;
- forming an interconnect structure on the photonic routing structure, wherein the interconnect structure comprises a plurality of conductive features in a plurality of first dielectric layers, wherein the interconnect structure is electrically coupled to the plurality of photonic devices;
- forming a plurality of computing sites on the interconnect structure, wherein forming each computing site comprises directly bonding a respective semiconductor die to the interconnect structure, wherein each computing site is electrically coupled to at least one respective photonic device;
- forming a second dielectric layer over the interconnect structure and on sidewalls of the semiconductor dies; and
- mounting an optical fiber over the second dielectric layer, wherein the optical fiber is optically coupled to the silicon waveguide through the second dielectric layer and through the plurality of first dielectric layers.

11. The method of claim 10, wherein the photonic routing structure further comprises a grating coupler, wherein the silicon waveguide is optically coupled to the grating coupler.

12. The method of claim 11, wherein the grating coupler is configured to optically couple to the optical fiber.

13. The method of claim 10, wherein each semiconductor die of the plurality of computing sites is electrically connected to a corresponding photonic device of the plurality of photonic devices.

14. The method of claim 10, wherein connecting the respective semiconductor die to the interconnect structure comprises a direct bonding process.

15. The method of claim 10 further comprising, before forming the interconnect structure, forming through vias extending through the photonic routing structure.

16. A method comprising:
- forming a waveguide on a substrate;
- after forming the waveguide, forming through vias extending through the substrate;
- after forming the through vias, forming an interconnect structure over the waveguide and over the through vias, wherein the interconnect structure directly contacts the through vias;
- bonding a plurality of semiconductor devices to the interconnect structure, wherein each semiconductor device is communicatively coupled to the waveguide;
- surrounding the plurality of semiconductor devices with a dielectric material, wherein top surfaces of the semiconductor devices are exposed; and
- bonding the through vias to an interconnect substrate, wherein the through vias are communicatively coupled to the interconnect substrate.

17. The method of claim 16 further comprising forming a plurality of photodetectors in the waveguide, wherein each semiconductor device is communicatively coupled to the waveguide by a respective photodetector.

18. The method of claim 16, wherein top surfaces of the semiconductor devices and the dielectric material are level.

19. The method of claim 16, wherein the waveguide is continuous.

20. The method of claim 16, wherein the dielectric material is a molding material.

* * * * *